United States Patent
Matsuyoshi et al.

(10) Patent No.: US 7,046,972 B2
(45) Date of Patent: May 16, 2006

(54) PREDISTORTION LINEARIZER AND PREDISTORTION DISTORTION COMPENSATION METHOD, PROGRAM, AND MEDIUM

(75) Inventors: Toshimitsu Matsuyoshi, Katano (JP); Kaoru Ishida, Shijonawate (JP); Seiji Fujiwara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 949 days.

(21) Appl. No.: 10/118,704

(22) Filed: Apr. 9, 2002

(65) Prior Publication Data
US 2002/0177424 A1  Nov. 28, 2002

(30) Foreign Application Priority Data
Apr. 10, 2001  (JP) ............................. 2001-110888

(51) Int. Cl.
*H04B 1/04*  (2006.01)
(52) U.S. Cl. ............................... 455/114.3; 455/114.1; 455/114.2; 375/295; 375/296; 375/297
(58) Field of Classification Search ............ 455/114.1, 455/114.2, 114.3; 375/295, 296, 297
See application file for complete search history.

(56) References Cited

U.S. PATENT DOCUMENTS

| | | | |
|---|---|---|---|
| 5,493,252 A * | 2/1996 | Takai | 330/52 |
| 5,877,653 A * | 3/1999 | Kim et al. | 330/149 |
| 6,028,477 A * | 2/2000 | Gentzler | 330/149 |
| 6,104,241 A * | 8/2000 | Cova et al. | 330/149 |
| 6,211,734 B1 * | 4/2001 | Ahn | 330/149 |

FOREIGN PATENT DOCUMENTS

| | | |
|---|---|---|
| DE | 197 20 019 A | 5/1998 |
| GB | 2 353 646 A | 2/2001 |
| JP | 2000-261252 | 9/2000 |

OTHER PUBLICATIONS

European Search Report for EP 02 00 7937, dated Apr. 21, 2004.

* cited by examiner

*Primary Examiner*—Duc Nguyen
*Assistant Examiner*—Tuan Pham
(74) *Attorney, Agent, or Firm*—RatnerPrestia

(57) ABSTRACT

A predistortion linearizer has signal dividing circuit dividing an input signal into two signals; signal adjusting circuit using one of the divided signals to execute predetermined adjustment and outputting a signal based on the adjustment; distortion signal generating circuit generating a distortion signal using the signal output from the signal adjusting circuit; signal synthesizing circuit synthesizing the other of the divided signals with the generated distortion signal; and signal amplifying circuit amplifying the synthesized signal and outputting an output signal, and wherein the signal adjusting circuit executes the predetermined adjustment such that there is a predetermined relationship between the level of a difference between the signal amplitudes of predetermined frequency components contained in a distortion signal and the level of a difference between the signal amplitudes of the predetermined frequency components contained in a distortion signal.

25 Claims, 12 Drawing Sheets

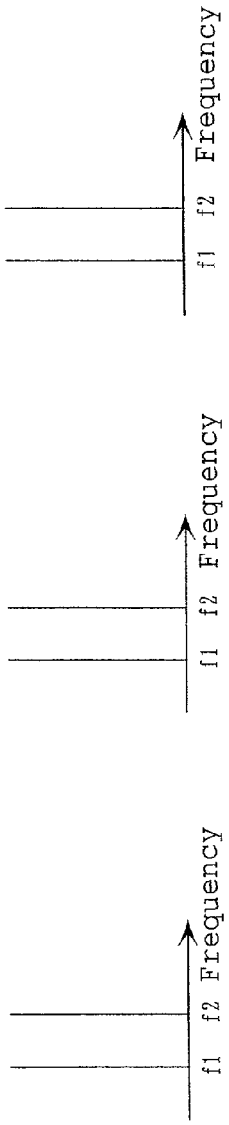
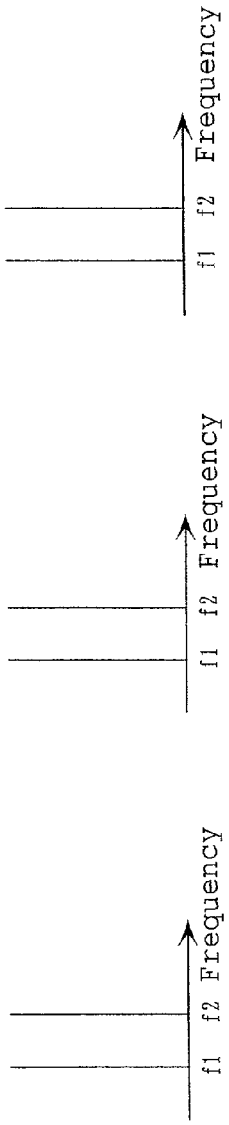
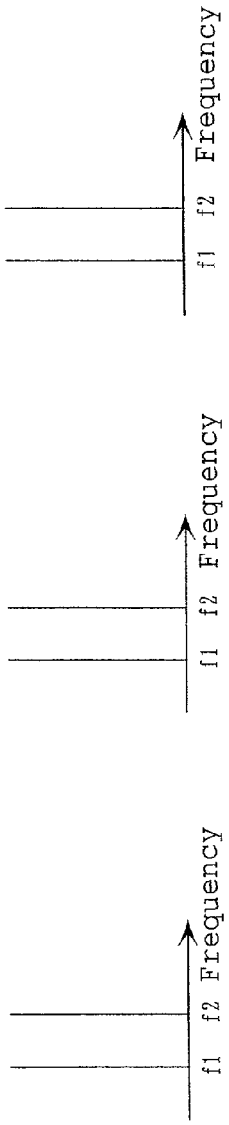
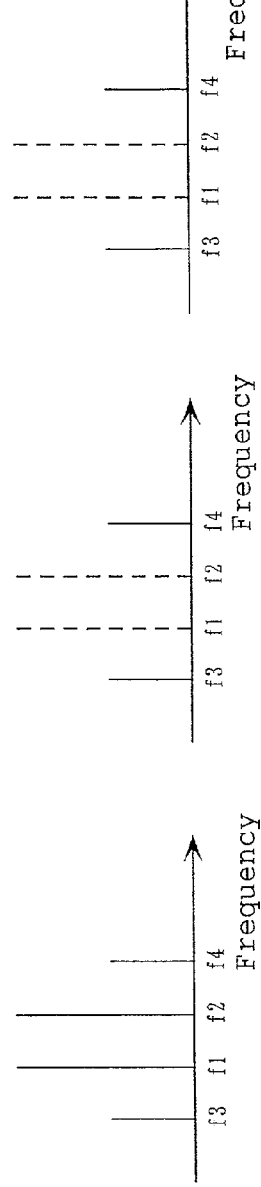
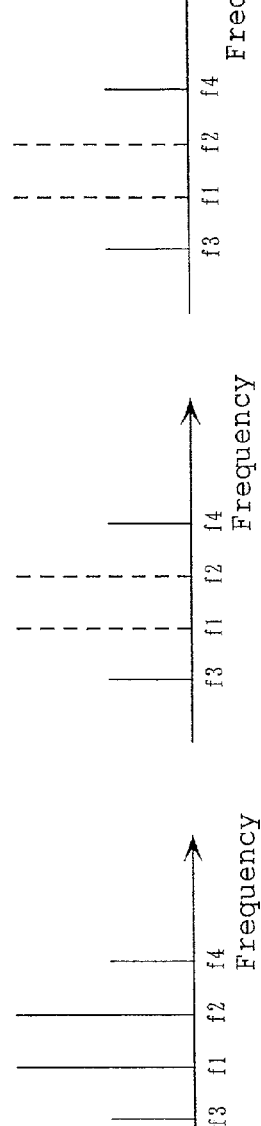
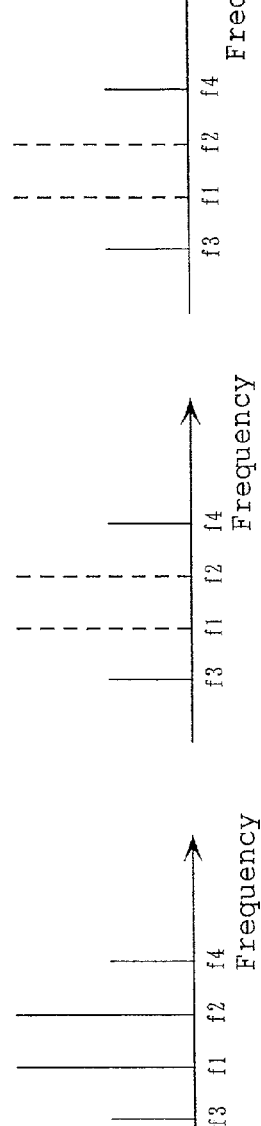
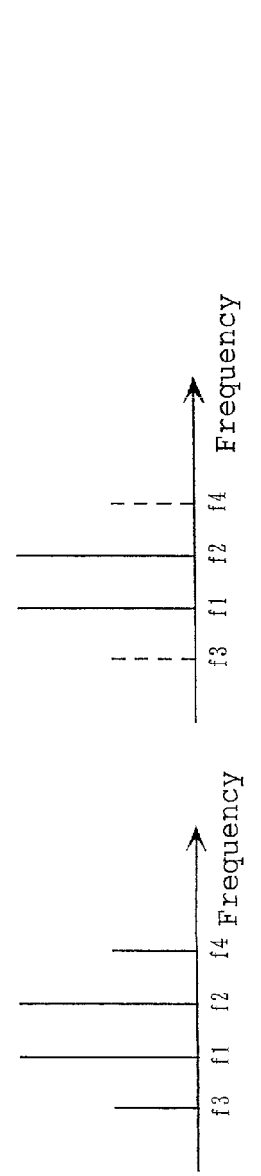
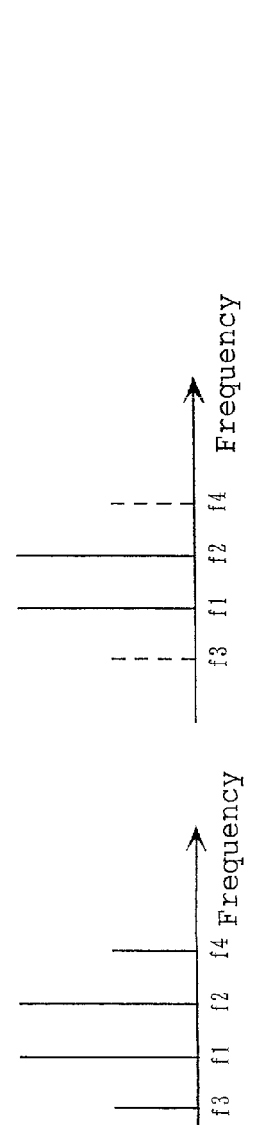

Fig. 3
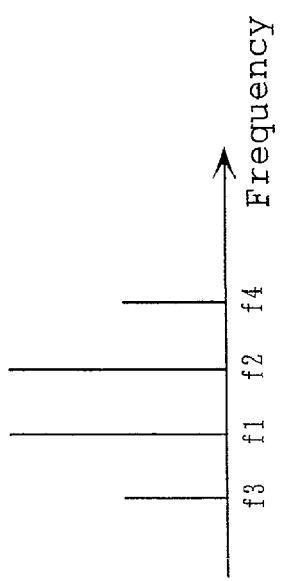
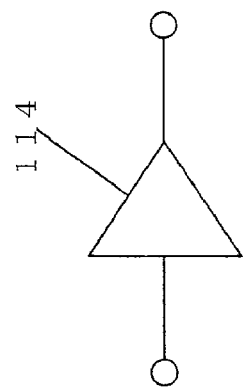
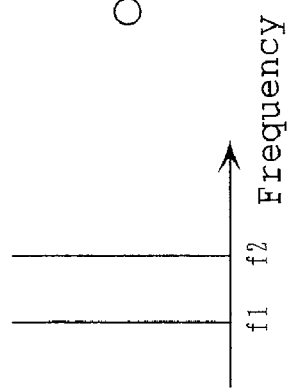

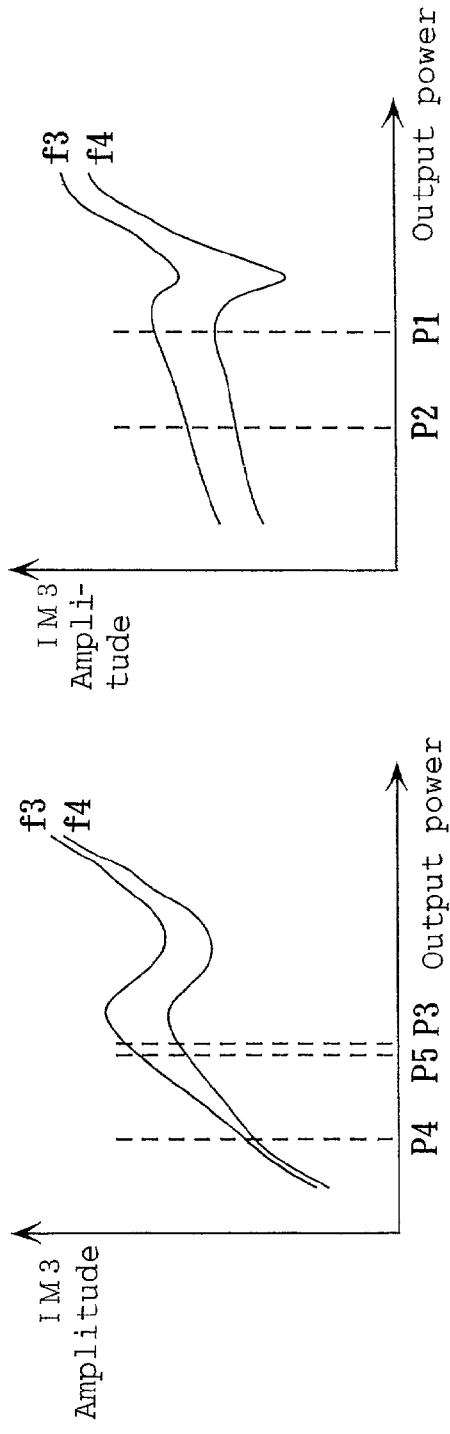
Fig. 11(a)
Fig. 11(b)
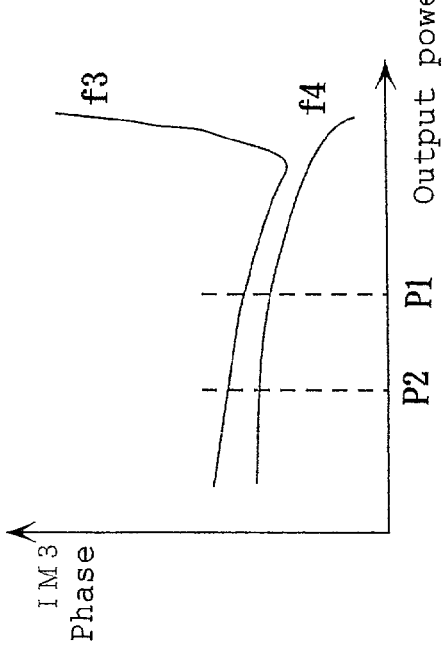
Fig. 11(c)
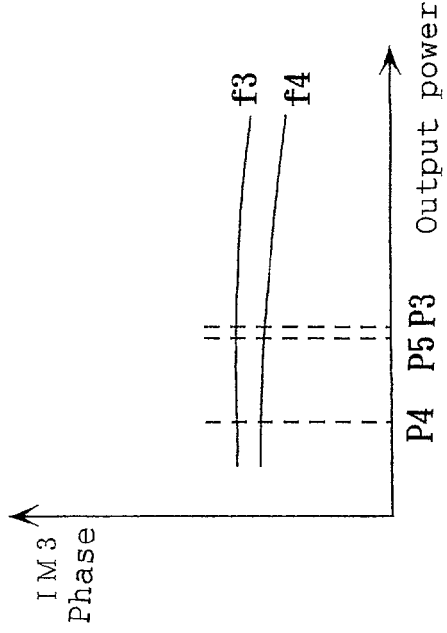
Fig. 11(d)

PREDISTORTION LINEARIZER AND PREDISTORTION DISTORTION COMPENSATION METHOD, PROGRAM, AND MEDIUM

BACKGROUND OF THE INVENTION

1. Field of the Invention

The present invention relates to a predistortion linearizer and predistortion distortion compensation method, a program, and a medium which are used at communication base stations for mobile units such as cellular phones.

2. Related Art of the Invention

In recent years, transmitters at base stations for mobile communication equipment have required very efficient and linear power amplifiers in order to collectively amplify a large number of signal channels. To improve the linearity of a power amplifier, a predistortion linearizer based on, for example, a predistortion system must be employed.

Here, the configuration and operation of a conventional predistortion linearizer will be described below with reference to FIG. 10, which is a block diagram thereof.

In FIG. 10, reference numeral 601 denotes an input terminal, 602 is an output terminal, 603 is a power divider, 604 is a delay circuit, 605 is a distortion generating circuit, 606 is a variable attenuator, 607 is a variable phase shifter, 608 is a power synthesizer, 609 is a power amplifier, 610 is a directional coupler, and 611 is a control section.

Such a circuit configuration is disclosed in, for example, Japanese Patent Laid-Open No. 2000-261252. In this case, intermodulation distortion that may occur in the power amplifier 609 can be reduced by controlling the variable attenuator 606 and the variable phase shifter 607 so that the power amplifier 609 receives, as an input, a signal having the same amplitude (dBc value) as an intermodulation distortion (IM) component that may occur in the power amplifier 609 as well as an opposite phase relative to this component.

Then, an intermodulation distortion characteristic observed if two sine waves of frequencies f1 and f2 (f1<f2) are input to the distortion generating circuit 605 and the power amplifier 609, respectively, will be described with reference to FIGS. 11(a) to 11(d).

FIG. 11(a) is a chart illustrating the distortion amplitude characteristic of the distortion generating circuit 605. FIG. 11(b) is a chart illustrating the distortion phase characteristic of the distortion generating circuit 605. FIG. 11(c) is a chart illustrating the distortion amplitude characteristic of the power amplifier 609. FIG. 11(d) is a chart illustrating the distortion phase characteristic of the power amplifier 609. (The axes of abscissas in FIGS. 11(a) and 11(b) indicate the output power of the distortion generating circuit 605 (the amplifier thereof), whereas the axes of abscissas in FIGS. 11(c) and 11(d) indicate the output power of the power amplifier 609. Further, a dBm unit is used on the axes of ordinates in FIGS. 11(a) and 11(c), whereas a deg unit is used on the axes of ordinates in FIGS. 11(b) and 11(d)).

When the frequency of an intermodulation distortion component generated on the low frequency side of the frequency f1 is defined as f3 and the frequency of an intermodulation distortion component generated on the high frequency side of the frequency f2 is defined as f4, these frequencies have different distortion amplitude characteristics and different distortion phase characteristics. That is, the distortion amplitude and phase characteristics of the distortion generating circuit 605 and power amplifier 609 depend on an output level.

It is common that the distortion generating circuit and the power amplifier have different distortion characteristics.

However, in the configuration of the conventional predistortion linearizer (see FIG. 10), the operation level of the distortion generating circuit 605 varies in proportion to the operation level of the power amplifier 609. Thus, it has been difficult to compensate for distortion over a wide range of output levels.

More specifically, as shown in FIGS. 11(a) to 11(d), if for example, the operation level of the power amplifier 609 changes from P1 to P2 (for example, substantially half of P1), the operation level of the distortion generating circuit 605 changes from P3 to P4 (for example, substantially half of P3).

Distortion is effectively compensated for because the distortion level observed if the operation level of the power amplifier 609 is P1 substantially equals the distortion level observed if the operation level of the distortion generating circuit 605 is P3 (that is, the difference in graph value for distortion amplitude or phase between the frequencies f3 and f4 at the former operation level equals the difference in graph value for distortion amplitude or phase between the frequencies f3 and f4 at the latter operation level). However, since the distortion level observed if the operation level of the power amplifier is P2 significantly differs from the distortion level observed if the operation level of the distortion generating circuit is P4 (that is, the difference in graph value at the former operation level differs from the difference in graph value at the latter operation level), distortion is not sufficiently compensated for regardless of the manner in which vector adjustment is carried out in the variable attenuator 606 and variable phase shifter 607.

SUMMARY OF THE INVENTION

In view of these conventional problems, it is an object of the present invention to provide a predistortion linearizer and predistortion distortion compensation method, a program, and a medium which can produce a distortion compensation effect over a wide range of output levels.

One aspect of the present invention is a predistortion linearizer comprising:

signal dividing means of dividing an input signal that has been input, into two signals;

signal adjusting means of using one of said divided signals to execute predetermined adjustment and outputting a signal based on a result of the adjustment;

distortion signal generating means of generating a distortion signal using the signal output from said signal adjusting means;

signal synthesizing means of synthesizing the other of said divided signals with said generated distortion signal; and signal amplifying means of amplifying said synthesized signal and outputting an output signal, and wherein said signal adjusting means executes said predetermined adjustment such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between phases of said predetermined frequency components contained in the distortion signal generated by said signal amplifying means.

Another aspect of the present invention is a predistortion linearizer comprising:

signal variable dividing means of dividing an input signal that has been input, into two signals at a variable division ratio;

distortion signal generating means of generating a distortion signal using one of said divided signals;

signal synthesizing means of synthesizing the other of said divided signals with said generated distortion signal; and signal amplifying means of amplifying said synthesized signal and outputting an output signal, and wherein said signal variable dividing means varies said division ratio such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between the phases of said predetermined frequency components contained in the distortion signal generated by said signal amplifying means.

Still another aspect of the present invention is a predistortion linearizer comprising:

signal dividing means of dividing an input signal that has been input, into two signals;

distortion signal generating means of generating a distortion signal using one of said divided signals and a predetermined bias voltage;

bias voltage control means of controlling said bias voltage;

signal synthesizing means of synthesizing the other of said divided signals with said generated distortion signal; and signal amplifying means of amplifying said synthesized signal and outputting an output signal, and wherein said bias voltage control means controls said bias voltage such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between the phases of said predetermined frequency components contained in the distortion signal generated by said signal amplifying means.

Yet still another aspect of the present invention is the predistortion linearizer, wherein the predetermined relationship between the level of the difference between the signal amplitudes of the predetermined frequency components contained in the distortion signal generated by said distortion signal generating means and the level of the difference between the signal amplitude of said predetermined frequency components contained in the distortion signal generated by said signal amplifying means means that a difference between the signal amplitude, i.e. dBc values, of said predetermined frequency components contained in the distortion signal generated by said distortion signal generating means substantially equals a difference between the signal amplitudes, i.e. dBc values, of said predetermined frequency components contained in the distortion signal generated by said signal amplifying means.

Still yet another aspect of the present invention is the predistortion linearizer, wherein the predetermined relationship between the difference between the phases of said predetermined frequency components contained in the distortion signal generated by said distortion signal generating means and the difference between the phases of said predetermined frequency components contained in the distortion signal generated by said signal amplifying means means that a difference between the phases, i.e. deg values, of said predetermined frequency components contained in the distortion signal generated by said distortion signal generating means substantially equals a difference between the phases, i.e. deg values, of said predetermined frequency components contained in the distortion signal generated by said signal amplifying means.

A further aspect of the present invention is the predistortion linearizer, further comprising:

a first delay circuit that adjusts a propagation delay time for the other of the signals divided by said signal dividing means; and detection signal dividing means of dividing the signal amplified by said signal amplifying means, into a detection signal and an external signal, and wherein said signal adjusting means has a detector that detects the level of said detection signal and outputs the level as a control signal, and a variable power divider that divides one of the signals divided by said signal dividing means, at a variable division ratio, said distortion signal generating means has a second delay circuit that adjusts a propagation delay time for one of the signals divided by said variable power divider, a distortion generating circuit that generates said distortion signal by receiving the other of the signals divided by said variable power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and said variable power divider varies said division ratio using said control signal.

A still further aspect of the present invention is the predistortion linearizer, further comprising:

a first delay circuit that adjusts a propagation delay time for the other of the signals divided by said signal dividing means;

detection signal dividing means of dividing the signal amplified by said signal amplifying means, into a detection signal and an external signal; and a power divider that divides one of the signals divided by said signal dividing means, and wherein said signal adjusting means has a detector that detects the level of said detection signal and outputs the level as a control signal, and power level adjusting means of adjusting the power level of one of the signals divided by said power divider, said distortion signal generating means has a second delay circuit that adjusts a propagation delay time for the other of the signals divided by said power divider, a distortion generating circuit that generates said distortion signal by receiving the signal adjusted by said power level adjusting means, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein the gain of said power level adjusting means is varied using said control signal.

A yet further aspect of the present invention is the predistortion linearizer, further comprising:

a first delay circuit that adjusts a propagation delay time for the other of the signals divided by said signal dividing means;

power level adjusting means of adjusting the power level of an output signal from said first delay circuit; and detection signal dividing means of dividing the signal amplified by said signal amplifying means, into a detection signal and an external signal, and wherein said signal variable dividing means has a detector that detects the level of said detection signal and outputs the level as a control signal, a variable power divider that variably divides said input signal, and a power divider that divides one of the signals divided by said variable power divider, said distortion signal generating means has a second delay circuit that adjusts a propagation delay time for one of the signals divided by said power divider, a distortion generating circuit that generates said distortion signal by receiving the other of the signals divided by said power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein by using said control signal, said signal variable dividing means varies said division ratio and the gain of said power level adjusting means is varied.

A still yet further aspect of the present invention is the predistortion linearizer, further comprising:

a first delay circuit that adjusts a propagation delay time for the other of the signals divided by said signal dividing means; and detection signal dividing means of dividing the signal amplified by said signal amplifying means, into a detection signal and an external signal, and wherein said bias voltage control means has a detector that detects the level of said detection signal and outputs the level as a control signal, said distortion signal generating means has a power divider that divides one of the signals divided by said signal dividing means, a second delay circuit that adjusts a propagation delay time for one of the signals divided by said power divider, a distortion generating circuit that generates said distortion signal by receiving the other of the signals divided by said power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein said bias voltage is controlled by using said control signal.

An additional aspect of the present invention is the predistortion linearizer, further comprising:

detection signal dividing means of dividing an external signal into said input signal and said detection signal; and a first delay circuit that adjusts a propagation delay time for the other of the signals divided by said signal dividing means, and wherein said signal adjusting means has a detector that detects the level of said detection signal and outputs the level as a control signal, and a variable power divider that divides one of the signals divided by said signal dividing means, said distortion signal generating means has a second delay circuit that adjusts a propagation delay time for one of the signals divided by said variable power divider, a distortion generating circuit that generates said distortion signal by receiving the other of the signals divided by said variable power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein said variable power divider varies said division ratio using said control signal.

A still additional aspect of the present invention is the predistortion linearizer, further comprising a storage device that stores data used to generate said control signal.

A yet additional aspect of the present invention is the predistortion linearizer, wherein said power level adjusting means is constructed using a variable gain amplifier or a variable attenuator.

A still yet additional aspect of the present invention is the predistortion linearizer, wherein said variable power divider is constructed by using a variable directional coupler.

A supplementary aspect of the present invention is the predistortion linearizer, wherein said delay circuit is constructed by using a filter.

A still supplementary aspect of the present invention is a predistortion linearizer comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input ;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

said second power dividing means can vary power division ratio in response to a control signal, the control signal is supplied to at least one of said second power dividing means and said distortion generating circuit, and the control signal is supplied from an output of said detecting means.

A yet supplementary aspect of the present invention is a predistortion linearizer comprising:

first power dividing means of dividing an input signal;

first propagation time delay means of adjusting a propagation delay time for the signal divided by said first power dividing means;

power level adjusting means of adjusting the power level of an output signal from said first propagation time delay means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said power level adjusting means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

a power division ratio used by said first power dividing means and gain of said power level adjusting means can be varied in response to a control signal, the control signal is supplied to at least one of said first power dividing means, said power level adjusting means, and said distortion generating circuit, and the control signal is supplied from an output of said detecting means.

A still yet supplementary aspect of the present invention is a predistortion linearizer comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

power level adjusting means of adjusting the power level of the signal divided by said second power dividing means;

distortion generating means of generating a distortion signal by receiving the signal divided by said power level adjusting means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

gain of said power level adjusting means can be varied in response to a control signal, and the control signal is supplied from an output of said detecting means.

Another aspect of the present invention is a predistortion linearizer comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

a bias voltage at said distortion generating means can be varied in response to a control signal, and the control signal is supplied from an output of said detecting means.

Still another aspect of the present invention is a predistortion linearizer comprising:

first power dividing means of dividing an input signal;

second power dividing means of dividing the signal divided by said first power dividing means;

first propagation time delay means of adjusting a propagation delay time for the signal divided by said second power dividing means;

third power dividing means of dividing the signal divided by said second power dividing means;

second propagation time delay means of adjusting a propagation delay time for the signal divided by said third power dividing means;

distortion generating means of generating a distortion signal by receiving the signal divided by said third power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means; and detecting means of detecting the level of the signal divided by said first power dividing means, and in that:

said third power dividing means can vary power division ratio in response to a control signal, the control signal is supplied to at least one of said third power dividing means and said distortion generating circuit, and the control signal is supplied from an output of said detecting means.

Yet still another aspect of the present invention is the predistortion linearizer, further comprising a control circuit that provides, on the basis of a result of said predetermined adjustment, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

Still yet another aspect of the present invention is the predistortion linearizer, further comprising a control circuit that provides, on the basis of a result of the variation in said division ratio, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

A further aspect of the present invention is the predistortion linearizer, further comprising a control circuit that provides, on the basis of a result of the control of said bias voltage, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

A still further aspect of the present invention is a predistortion distortion compensation method comprising:

a signal dividing step of dividing an input signal that has been input, into two signals;

a distortion signal generating step of generating a distortion signal using one of said divided signals;

a signal synthesizing step of synthesizing the other of said divided signals with said generated distortion signal;

a signal amplifying step of amplifying said synthesized signal and outputting an output signal; and a control step of controlling input power and/or a bias voltage used in said distortion signal generating step such that (1) there is a predetermined relationship between the level of a difference between the signal amplitudes of predetermined frequency components contained in a distortion signal generated in said distortion signal generating step and the level of a difference between the signal amplitudes of said predetermined frequency components contained in a distortion signal generated in said signal amplifying step and/or (2) there is a predetermined relationship between a difference between the phases of said predetermined frequency components contained in the distortion signal generated in said distortion signal generating step and a difference between the phases of said predetermined frequency components contained in the distortion signal generated in said signal amplifying step.

A yet further aspect of the present invention is a program for causing a computer to execute all or part of the steps of: dividing an input signal that has been input, into two signals; generating a distortion signal using one of said divided signals; synthesizing the other of said divided signals with said generated distortion signal; amplifying said synthesized signal and outputting an output signal; and controlling input power and/or a bias voltage used in said distortion signal generating step such that (1) there is a predetermined relationship between the level of a difference between the signal amplitudes of predetermined frequency components contained in a distortion signal generated in said distortion signal generating step and the level of a difference between the signal amplitudes of said predetermined frequency components contained in a distortion signal generated in said signal amplifying step and/or (2) there is a predetermined relationship between a difference between the phases of said predetermined frequency components contained in the distortion signal generated in said distortion signal generating step and a difference between the phases of said predetermined frequency components contained in the distortion signal generated in said signal amplifying step; in the predistortion distortion compensation method.

A still yet further aspect of the present invention is a computer-processable medium carrying a program.

BRIEF DESCRIPTION OF THE DRAWINGS

FIG. 2(a) is a diagram illustrating a frequency spectrum of a signal obtained at a terminal a according to Embodiment 1 of the present invention. FIG. 2(b) is a diagram illustrating a frequency spectrum of a signal obtained at a terminal b according to Embodiment 1 of the present invention. FIG. 2(c) is a diagram illustrating a frequency spectrum of a signal obtained at a terminal c according to Embodiment 1 of the present invention. FIG. 2(d) is a diagram illustrating a frequency spectrum of a signal obtained at a terminal d according to Embodiment 1 of the present invention. FIG. 2(e) is a diagram illustrating a frequency spectrum of a signal obtained at a terminal e according to Embodiment 1 of the present invention. FIG. 2(f) is a diagram illustrating a frequency spectrum of a signal obtained at a terminal f according to Embodiment 1 of the present invention. FIG. 2(g) is a diagram illustrating a frequency spectrum of a signal obtained at a terminal g according to Embodiment 1 of the present invention. FIG. 2(h) is a diagram illustrating a frequency spectrum of a signal obtained at a terminal h according to Embodiment 1 of the present invention.

FIG. 3 is a diagram illustrating an amplification characteristic of a power amplifier 114 according to Embodiment 1 of the present invention.

FIG. 11(a) is a diagram illustrating a distortion amplitude characteristic of a distortion generating circuit 605. FIG. 11(b) is a diagram illustrating the distortion phase characteristic of the distortion generating circuit 605. FIG. 11(c) is a diagram illustrating the distortion amplitude characteristic of a power amplifier 609. FIG. 11(d) is a diagram illustrating the distortion phase characteristic of the power amplifier 609.

DESCRIPTION OF SYMBOLS

Figure 1:
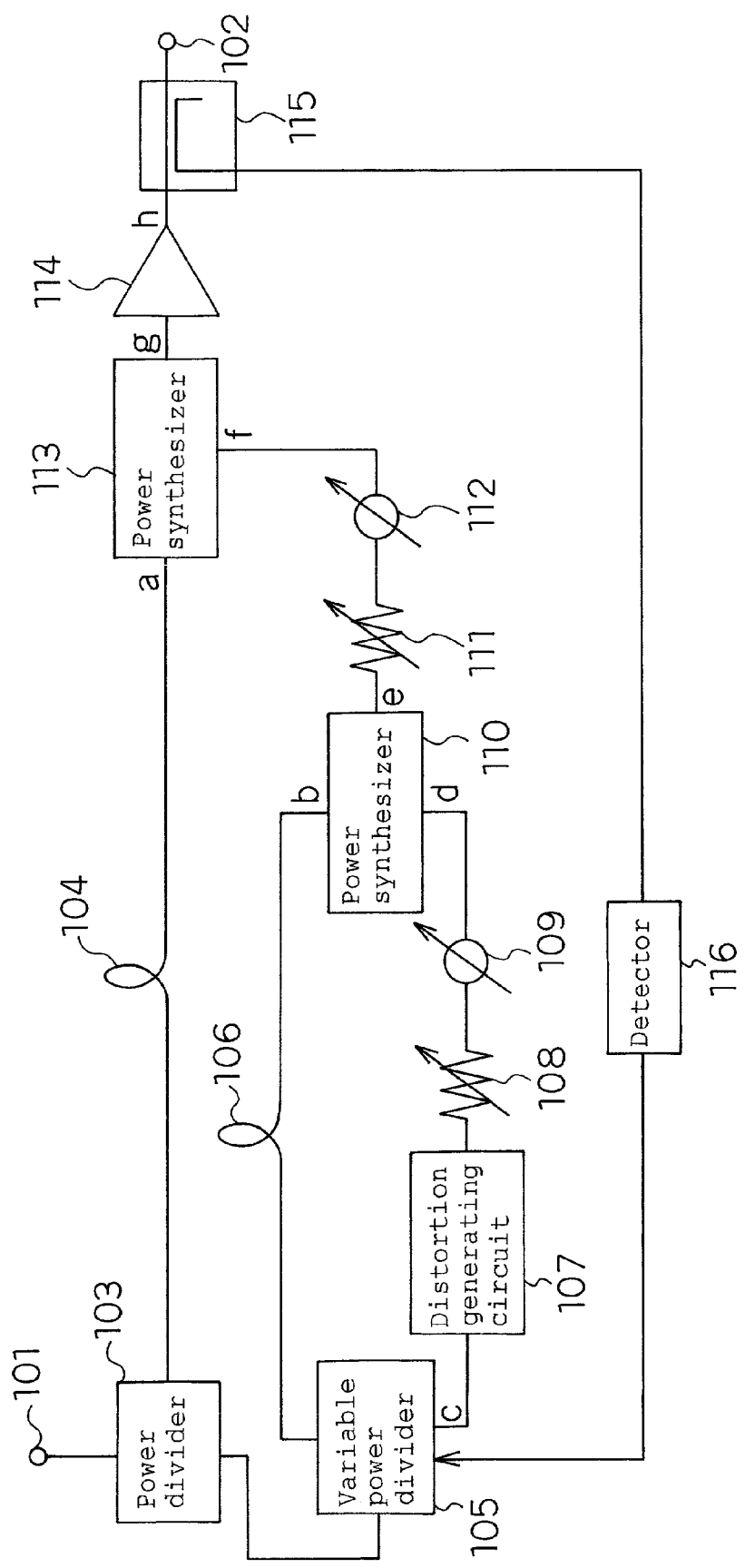
FIG. 1 is a block diagram of a predistortion linearizer according to Embodiment 1 of the present invention.

101 Input terminal
102 Output terminal
103, 121 Power divider
104, 106 Delay circuit
105 Variable power divider
107 Distortion generating circuit
108, 111 Variable attenuator
109, 112 Variable phase shifter
110, 113 Power synthesizer
114 Power amplifier
115, 132 Directional coupler
116 Detector
131 Gain variable amplifier

PREFERRED EMBODIMENTS OF THE INVENTION

Embodiments of the present invention will be described below with reference to the drawings.

Embodiment 1

First, a configuration of a predistortion linearizer according to Embodiment 1 will be described with reference to FIG. 1. FIG. 1 is a block diagram of the predistortion linearizer of this embodiment.

In FIG. 1, reference numeral 101 denotes an input terminal, 102 is an output terminal, 103 is a power divider, 104 and 106 are delay circuits, 105 is a variable power divider, 107 is a distortion generating circuit, 108 and 111 are variable attenuators, 109 and 112 are variable phase shifters, 110 and 113 are power synthesizers, 114 is a power amplifier, 115 is a directional coupler, and 116 is a detector.

The variable power divider 105 is composed of, for example, a directional coupler that can vary the degree of coupling using a control voltage. Further, the distortion generating circuit 107 and the power amplifier 114 are composed of transistors such as FETs (Field Effect Transistors). Furthermore, the delay circuits 104 and 106 are composed of coaxial cables such as semi-rigid cables.

The input terminal 101 is connected to the input of the power divider 103, and one end of the output of the power divider 103 is connected to one end of the input of the power synthesizer 113 via the delay circuit 104. On the other hand, the other end of the output of the power divider 103 is connected to the input of the variable power divider 105.

One end of the output of the variable power divider 105 is connected to one end of the input of the power synthesizer 110 via the delay circuit 106. On the other hand, the other end of the output of the variable power divider 105 is connected to the other end of the input of the power synthesizer 110 via the distortion generating circuit 107, the variable attenuator 108, and the variable phase shifter 109.

The output of the power synthesizer 110 is connected to the other end of the input of the power synthesizer 113 via the variable attenuator 111 and the variable phase shifter 112. The output of the power synthesizer 113 is connected to the output terminal 102 via the power amplifier 114 and the directional coupler 115. A coupling terminal of the directional coupler 115 is connected to the detector 116, the output of which is input to a control terminal of the variable power divider 105.

The power divider 103 of this embodiment corresponds to signal dividing means of the present invention (a first aspect thereof). Means including the variable power divider 105 and detector 116 of this embodiment corresponds to signal adjusting means of the present invention (the first aspect thereof). Means including the distortion generating circuit 107 of this embodiment corresponds to distortion signal generating means of the present invention (the first aspect thereof). The power synthesizer 113 of this embodiment corresponds to signal synthesizing means of the present invention (the first aspect thereof). The power amplifier 114 of this embodiment corresponds to signal amplifying means of the present invention (the first aspect thereof).

Furthers the operation of the power divider 103 of this embodiment corresponds to a signal dividing step of the present invention. The operation of the means including the distortion generating circuit 107 of this embodiment corresponds to a distortion signal generating step of the present invention. The operation of the power synthesizer 113 of this embodiment corresponds to a signal synthesizing step of the present invention. The operation of the power amplifier 114 of this embodiment corresponds to a signal amplifying step of the present invention. The operation of the means including the variable power divider 105 and detector 116 of this embodiment corresponds to a control step of the present invention.

Furthermore, the directional coupler 115 corresponds to detection signal dividing means of the present invention. Means including the variable attenuator 108 and the variable phase shifter 109 corresponds to first vector adjusting means of the present invention. Means including the variable attenuator 111 and the variable phase shifter 112 corresponds to second vector adjusting means of the present invention. Signals input through the input terminal 101 in this embodiment correspond to input signals that have been input according to the present invention.

Next, the operation of the predistortion linearizer of this embodiment will be described with reference to FIGS. 2(a) to 2(h). FIG. 2(a) is a diagram illustrating the frequency spectrum of a signal obtained at a terminal a. FIG. 2(b) is a diagram illustrating the frequency spectrum of a signal obtained at a terminal b. FIG. 2(c) is a diagram illustrating the frequency spectrum of a signal obtained at a terminal c. FIG. 2(d) is a diagram illustrating the frequency spectrum of a signal obtained at a terminal d. FIG. 2(e) is a diagram illustrating the frequency spectrum of a signal obtained at a terminal e. FIG. 2(f) is a diagram illustrating the frequency spectrum of a signal obtained at a terminal f. FIG. 2(g) is a diagram illustrating the frequency spectrum of a signal obtained at a terminal g. FIG. 2(h) is a diagram illustrating the frequency spectrum of a signal obtained at a terminal h.

FIGS. 2(a) to 2(h) show the frequency spectra of signals obtained at the terminals (see FIG. 1) of the circuit, but in this embodiment, it is assumed that two sine waves (carriers) of frequencies f1 and f2 are input to the input terminal 101.

The signal input to the input terminal 101 is divided into two by the power divider 103. One of the divided output signals is input to the terminal a of the power synthesizer 113 through the delay circuit 104. The spectrum of this signal is shown in FIG. 2(a).

On the other hand, the other output signal from the power divider 103 is further divided into two by the variable power divider 105. One of the divided signals is input to the terminal b of the power synthesizer 110 through the delay circuit 106. The spectrum of this signal is shown in FIG. 2(b). Here, a feature of this embodiment is that the division ratio used by the variable power divider 105 is appropriately varied.

Further, an output signal obtained at the terminal c of the variable power divider 105 which has the frequency spectrum in FIG. 2(c) is input to the distortion generating circuit 107. The distortion generating circuit 107 generates intermodulation distortion components f3 and f4, and outputs a signal containing the intermodulation distortion components f3 and f4, from its output. This output signal has its amplitude and phase adjusted by the variable attenuator 108 and the variable phase shifter 109, so that the spectrum shown in FIG. 2(d) is input to the terminal d of the power synthesizer 110.

At this time, a signal with the frequencies f1 and f2 obtained at the terminal b has the same amplitude as a signal with the frequencies f1 and f2 obtained at the terminal d as well as an opposite phase relative to the latter signal.

As a result, the carriers are suppressed so as to output only the intermodulation distortion components f3 and f4 from the output (terminal e) of the power synthesizer 110. The spectrum of this signal is shown in FIG. 2(e).

The intermodulation distortion components f3 and f4 obtained at the terminal e have their amplitudes and phases adjusted by the variable attenuator 111 and the variable phase shifter 112, so that the adjusted signal is input to the terminal f of the power synthesizer 113. The spectrum of this signal is shown in FIG. 2(f). A signal obtained at the terminal a and a signal obtained at the terminal f are synthesized by the power synthesizer 113, so that the synthesized signal is output from the output terminal g. The spectrum of this signal is shown in FIG. 2(g).

When two sine waves (carriers) of the frequencies f1 and f2 are input to the power amplifier 114, a signal containing the intermodulation distortion components f3 and f4 is output. The frequency spectrum observed at this time at the output of the power amplifier 114 is shown in FIG. 3. FIG. 3 is a diagram illustrating the amplification characteristic of the power amplifier 114.

Hence, if the levels of the intermodulation distortion components obtained at the terminal g, shown in FIG. 2(g), are set equal to the levels of those shown in FIG. 3, relative to the carriers, and if the moment the two carriers f1 and f2 have the same instantaneous phase, the phases of the intermodulation distortion components relative to the carriers in FIG. 2(g) are opposite to those in FIG. 3, then the intermodulation distortion components f3 and f4 are suppressed so as to output only the carrier components f1 and f2 at desired levels from the power amplifier 114 (see FIG. 1). The spectrum of the signal obtained at the terminal h in FIG. 1 is shown in FIG. 2(h).

In this manner, the intermodulation distortion components that may occur in the power amplifier 114 at arbitrary power levels can be effectively suppressed.

A signal obtained at the terminal h is divided into two by the directional coupler 115 so that most of the signal is output from the output terminal 102, with a part of the signal fetched from coupling terminal i. The signal fetched from the terminal i is used by the detector 116 to detect the power level so that the power division ratio used by the variable power divider 105 is varied depending on the detected level.

By thus varying the division ratio used by the variable power divider 105 depending on the output level, the operation level of the distortion generating circuit 107 can be arbitrarily set independently of the input signal level and the operation level of the power amplifier 114.

The intermodulation distortion characteristic observed if two sine waves are input to each of the power amplifier 114 and the distortion generating circuit 107 is substantially similar to the intermodulation distortion characteristic observed in the distortion generating circuit 605 and power amplifier 609 described previously (see FIGS. 11(a) to 11(d)).

A specific description will be given of the case where P1=45 dBm, P2=35 dBm, P3=20 dBm, P4=10 dBm, and P5=17 dBm.

If for example, the operation level of the power amplifier 114 decreases from P1=45 dBm to P2=35 dBm, then the detector 116 detects this to change the division ratio used by the variable power divider 105 so as to obtain a larger signal by division and provide it to the distortion generating circuit 104. The operation level of the distortion generating circuit 104 is reduced from P3=20 dBm only to P5=17 dBm (i.e. not reduced from P3=20 dBm to P4=10 dBm as in the prior art with the division ratio fixed).

Then, the distortion characteristics of the distortion generating circuit 104 and power amplifier 114 remain substantially equal even after the division ratio has been changed.

As in this embodiment, if the distortion amplitude characteristic varies markedly depending on the operation level (see FIGS. 11(a) and 11(c)), the amount of a change in the division ratio may be determined so that the distortion characteristics of the distortion generating circuit 104 and power amplifier 114 remain substantially equal. In actuality, the distortion phase characteristics of the distortion generating circuit 104 and power amplifier 114 do not vary significantly depending on the operation level (see FIGS. 11(b) and 11(d)) but remain substantially equal even after the division ratio has been changed.

Of course, if the distortion phase characteristics vary markedly depending on the operation level, the amount of a change in division ratio may be determined so that the distortion phase characteristics remain substantially equal.

Thus, in this embodiment, even if the operation level of the power amplifier 114 changes from P1 to P2, then by appropriately changing the division ratio used by the variable power divider 105 regardless of the amount of the change from P1 to P2, the operation level of the distortion generating circuit can be set at the optimum point, i.e. P5 (see FIGS. 11(a) to 11(d)). In this case, even if the operation level of the power amplifier 114 becomes P2, the distortion levels of the power amplifier and distortion generating circuit can be made substantially equal. Thus, even if the operation level of the power amplifier 114 changes, distortion can be effectively compensated to provide a predistortion linearizer with a wide dynamic range.

In this embodiment, the distortion generating circuit 107 and the power amplifier 114 are composed of FETs. However, the present invention is not limited to this aspect, but both of them may be composed of bipolar transistors. Further, the distortion generating circuit may be constructed by using diodes, and this construction has effects similar to those of this embodiment.

Further, in this embodiment, the delay circuits 104 and 106 are composed of coaxial cables such as semi-rigid cables, but may be composed of other transmission lines such as microstrip-type transmission lines or of delay filters. Furthermore, the present invention is not limited to the delay circuit used in this embodiment and which has a fixed propagation delay time, but it is possible to use a delay circuit such as a variable delay filter which can vary delay time.

Moreover, in this embodiment, an output signal from the detector 116 is used to vary the division ratio used by the variable power divider 105. Instead of it, a storage device may be interposed between the detector 116 and the variable power divider 105 to store such settings that a control signal is input to the variable power divider depending on the output power level. Accordingly, a control signal can be input to the variable power divider depending on the output power level. This configuration has effects similar to those of this embodiment.

Further, on the basis of the result of adjustment of the signal input to the distortion generating circuit 107 by the variable power divider 105, (1) control may be provided to adjust the amplitude and phase of an output signal from the distortion generating circuit 107 to the variable attenuator 108 and variable phase shifter 109, and (2) control may be provided to adjust the amplitude and phase of an output signal from the power synthesizer 110 to the variable attenuator 111 and the variable phase shifter 112.

For example, in this embodiment, an output signal from the detector 116 is used to control the division ratio used by the variable power divider 105. However, the present invention is not limited to this aspect, but it is possible to control the variable attenuators 108 and 111, the variable phase shifters 109 and 112, and the delay circuit 104 using an output signal from the detector 116.

Figure 12:
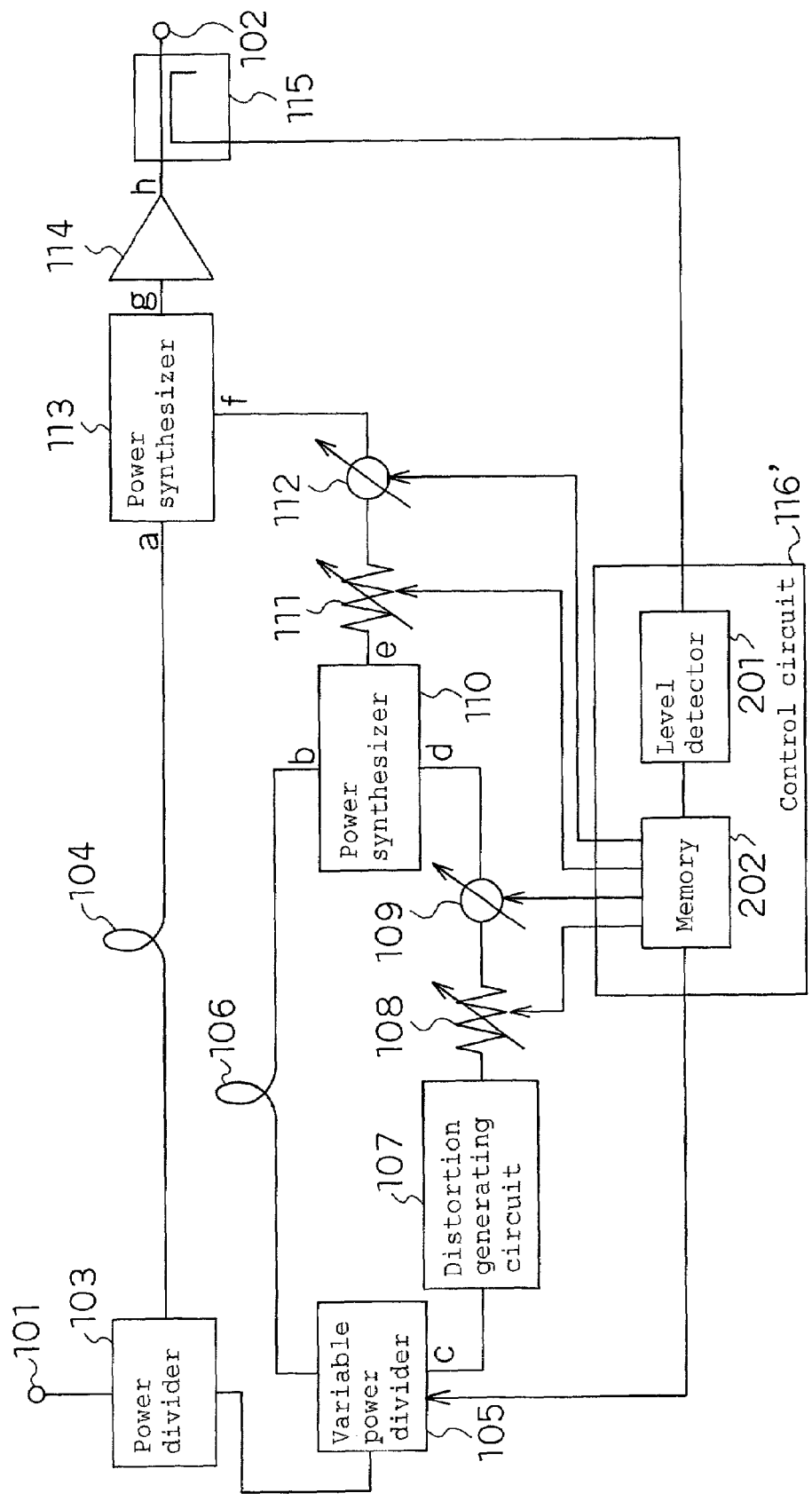
FIG. 12 is a block diagram of a predistortion linearizer comprising a control circuit 116' according to an embodiment of the present invention.

More specifically, as shown in FIG. 12, a control circuit 116' may be used which realizes the control by storing, in a memory 202, such settings that a level detector 201 detects the power level of a signal fetched from the directional coupler 115 in order to change the division ratio used by the variable power divider 105 and that in accordance with the result of the detection, a control signal is input not only to the variable power divider 105 but also to the variable attenuators 108 and 111 and variable phase shifters 109 and 112. FIG. 12 is a block diagram of a predistortion linearizer comprising the control circuit 116' according to the embodiment of the present invention.

When the variable attenuator 108 and the variable phase shifter 109 are appropriately controlled so that an output signal from the distortion generating circuit 107 and a signal that has passed through the delay circuit 106 have the same amplitude but opposite phases relative to the carriers, only the distortion signal can be precisely fetched from the power synthesizer 110 after the division ratio used by the variable power divider 105 is varied.

Of course, the variable attenuator 111 and the variable phase shifter 112 are controlled so that only the carrier components are the signals amplified by the power amplifier 114, thus injecting proper distortion signals into the power synthesizer 113.

Embodiment 2

Figure 4:
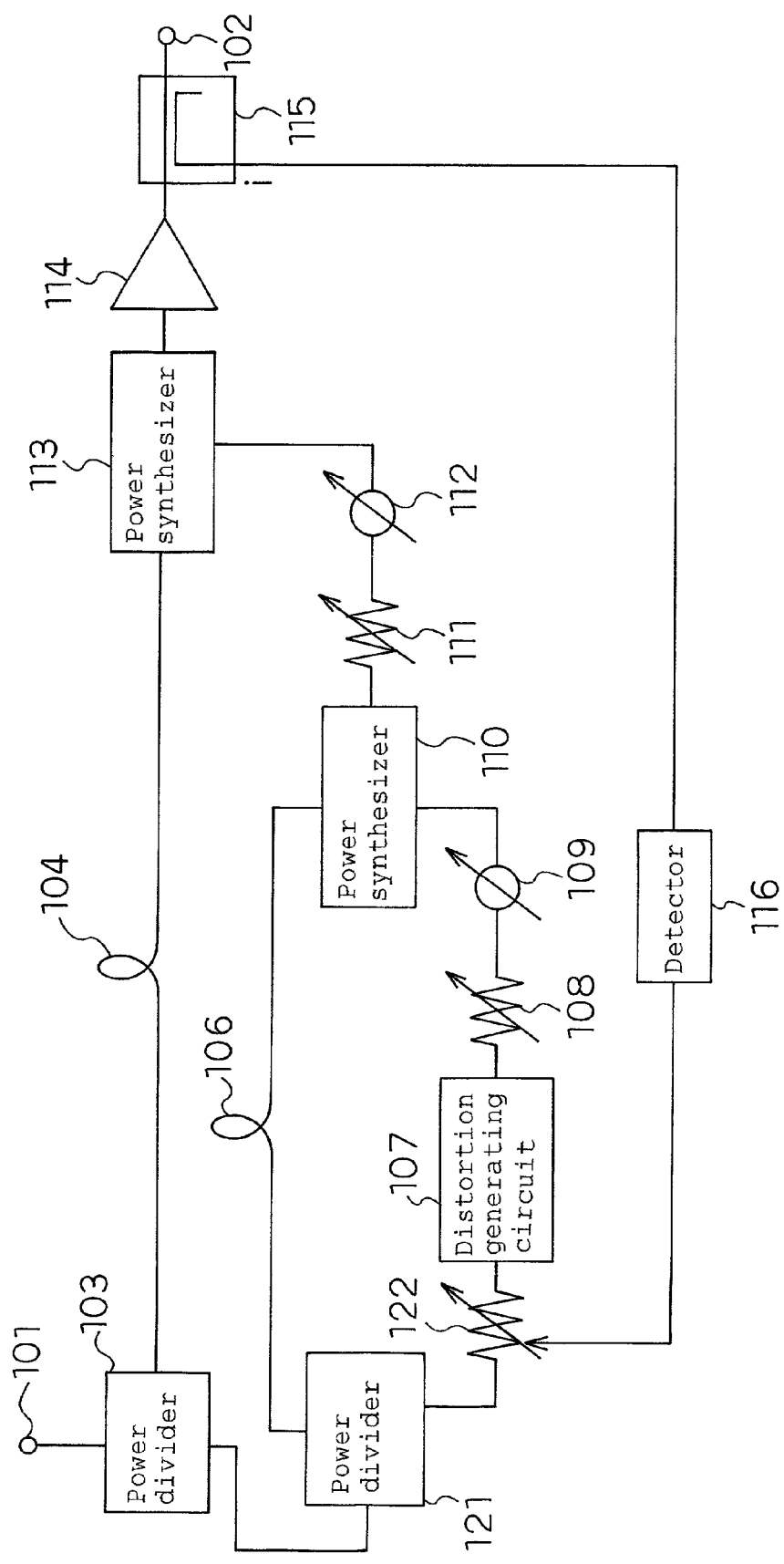
FIG. 4 is a block diagram of a predistortion linearizer according to Embodiment 2 of the present invention.

Now, the configuration and operation of a predistortion linearizer according to Embodiment 2 will be described with reference to FIG. 4. FIG. 4 is a block diagram of the predistortion linearizer of this embodiment.

The predistortion linearizer of this embodiment is constructed similarly to the predistortion linearizer of Embodiment 1, described previously. In the drawing, identical means in both embodiments are denoted by identical reference numerals.

However, in Embodiment 1, described previously, the power divider 105 can change the power division ratio, but in this embodiment, a power divider 121 is used in place of the variable power divider 105, and a variable attenuator 122 is installed at the input side of the distortion generating circuit 107.

That is, a signal fetched from the coupling terminal i of the directional coupler 115 is used by the detector 116 to detect the power level so that the amount of attenuation effected by the variable attenuator 122 is varied depending on the detected level.

Thus, as in Embodiment 1, the operation level of the distortion generating circuit 107 can be arbitrarily set regardless of the input signal level and the operation level of the power amplifier 114. As a result, the operation level of the distortion generating circuit 107 can be set so as to most effectively suppress distortion in connection with the operation level of the power amplifier 114. Thus, distortion can be compensated for even if the operation level of the power amplifier 114 changes, thereby realizing a predistortion linearizer with a wide dynamic range.

In this embodiment, the variable attenuator 122 is installed at the input side of the distortion generating circuit 107 so that the amount of attenuation is varied to change an operation point of the distortion generating circuit 107. However, a gain variable amplifier may be used in place of the variable attenuator 122. For example, the operation level required for the distortion generating circuit 107 (see FIG. 4) may be higher than that required if the amount of attenuation effected by the variable attenuator 122 (see FIG. 4) is set at 0 dB. However, the use of a gain variable amplifier in place of the variable attenuator 122 has effects similar to those of this embodiment.

Further, in this embodiment, the distortion generating circuit 107 and the power amplifier 114 are composed of FETs, but may both be composed of bipolar transistors. Furthermore, the distortion generating circuit may be constructed by using diodes, and this construction has effects similar to those of this embodiment.

Moreover, in this embodiment, an output signal from the detector 116 is used to vary the division ratio used by the variable attenuator 122. Instead of it, a storage device may be interposed between the detector 116 and the variable attenuator 122 to store such settings that a control signal is input to the variable attenuator depending on the output power level. Accordingly, a control signal can be input to the variable attenuator depending on the output power level. This configuration has effects similar to those of this embodiment.

Further, in this embodiment, an output signal from the detector 116 is used to control the division ratio used by the variable attenuator 122. However, the present invention is not limited to this aspect, but it is possible to control the variable attenuators 108 and 111, the variable phase shifters 109 and 112, and the delay circuit 104 by using an output signal from the detector 116.

The power divider 103 of this embodiment corresponds to the signal dividing means of the present invention (the first aspect thereof). Means including the detector 116 and variable attenuator 122 of this embodiment corresponds to the signal adjusting means of the present invention (the first aspect thereof). Means including the distortion generating circuit 107 of this embodiment corresponds to the distortion signal generating means of the present invention (the first aspect thereof). The power synthesizer 113 of this embodiment corresponds to the signal synthesizing means of the present invention (the first aspect thereof) The power amplifier 114 of this embodiment corresponds to the signal amplifying means of the present invention (the first aspect thereof)

Further, the operation of the power divider 103 of this embodiment corresponds to the signal dividing step of the present invention. The operation of the means including the distortion generating circuit 107 of this embodiment corresponds to the distortion signal generating step of the present invention. The operation of the power synthesizer 113 of this embodiment corresponds to the signal synthesizing step of the present invention. The operation of the power amplifier 114 of this embodiment corresponds to the signal amplifying step of the present invention. The operation of the means including the detector 116 and variable attenuator 122 of this embodiment corresponds to the control step of the present invention.

Further, the variable attenuator 122 corresponds to power level adjusting means of the present invention (a seventh aspect thereof).

Embodiment 3

Figure 5:
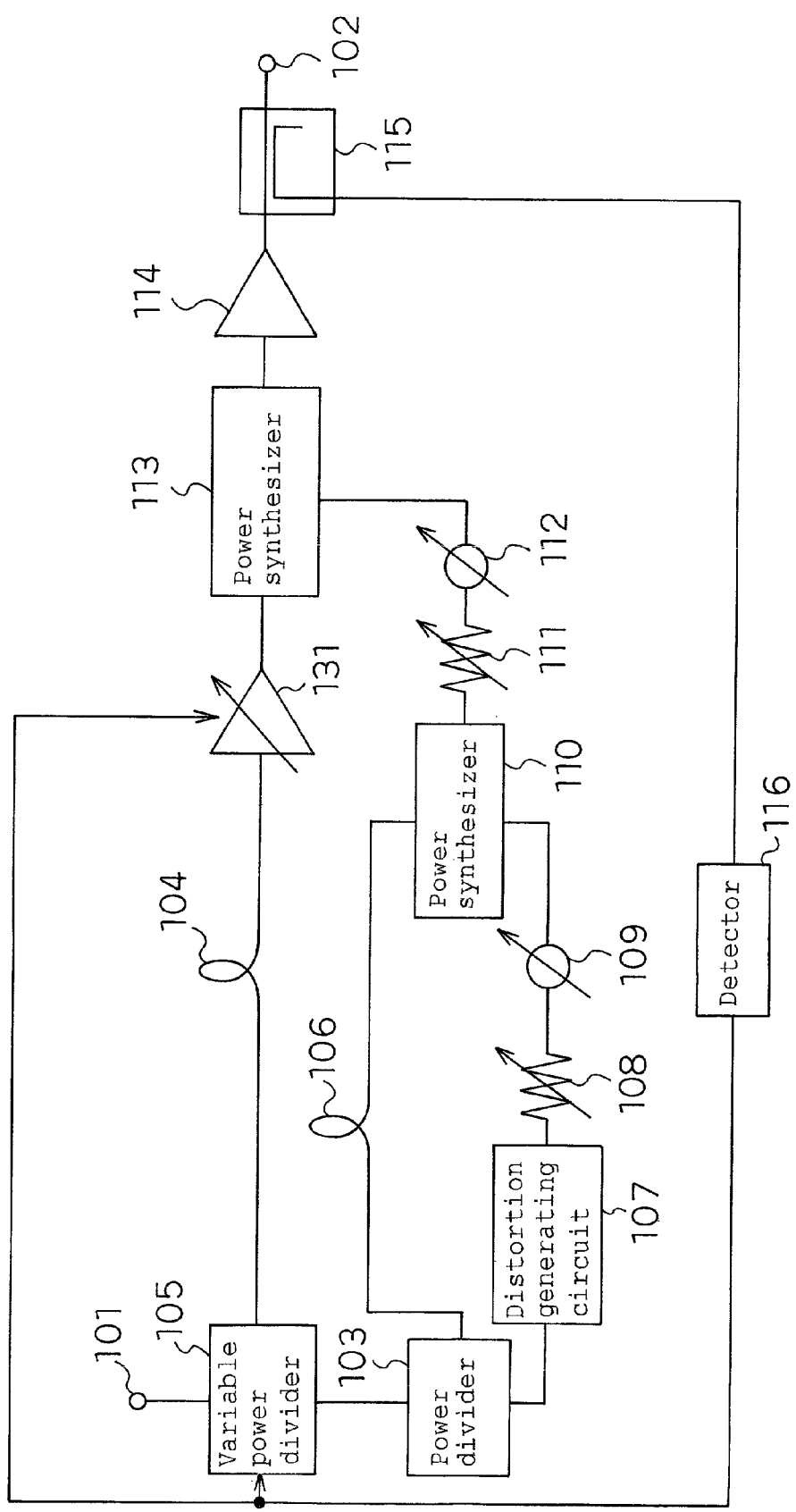
FIG. 5 is a block diagram of a predistortion linearizer according to Embodiment 3 of the present invention.

Now, the configuration and operation of a predistortion linearizer according to Embodiment 3 will be described with reference to FIG. 5. FIG. 5 is a block diagram of the predistortion linearizer of this embodiment.

The predistortion linearizer of this embodiment is constructed similarly to the predistortion linearizer of Embodiment 1, described previously. In the drawing, identical means in both embodiments are denoted by identical reference numerals.

However, in this embodiment, the power divider dividing a signal from the input terminal 101 is composed of the variable power divider 105, and a gain variable amplifier 131 is installed at the output side of the delay circuit 104. Further, the power divider dividing the signal divided by the variable power divider is composed of the power divider 103 with the division ratio fixed.

Thus, by using the variable element to divide the signal from the input terminal, the operation level of the distortion generating circuit 107 can be optimized for the operation level of the power amplifier 114. Further, if the division ratio used by the divider 105 is changed, the level of carriers output to the delay circuit 104 may decrease. However, in this case, the gain variable amplifier 131 amplifies the carrier level up to a desired value.

Thus, as in Embodiment 1, described previously, the operation level of the distortion generating circuit 107 can be arbitrarily set regardless of the input signal level and the operation level of the power amplifier 114. As a result, the operation level of the distortion generating circuit 107 can be set so as to most effectively suppress distortion in connection with the operation level of the power amplifier 114. Thus, distortion can be compensated for even if the operation level of the power amplifier 114 changes, thereby realizing a predistortion linearizer with a wide dynamic range.

In this embodiment, the divider dividing a signal from the input terminal 101 is composed of the power divider 105, using a variable division ratio, so as to change the operation level of the distortion generating circuit 107, and the gain variable amplifier 131 is installed at the output side of the delay circuit 104 to amplify the level of the input to the power amplifier 114 up to the desired level by varying the gain. However, it is contemplated that a variable attenuator may be used instead of the gain variable amplifier 131. For example, the operation level required for the power amplifier 114 may be lower than that required if the gain of the gain variable amplifier 131 (see FIG. 5) is set at 0 dB. However, the use of a variable attenuator instead of the gain variable amplifier 131 has effects similar to those of this embodiment.

Further, in this embodiment, the distortion generating circuit 107 and the power amplifier 114 are composed of FETs, but may both be composed of bipolar transistors. Furthermore, the distortion generating circuit may be constructed by using diodes, and this construction has effects similar to those of this embodiment.

Moreover, in this embodiment, an output signal from the detector 116 is used to vary the division ratio used by the variable power divider 105 and the gain of the gain variable amplifier 131. Instead of it, a storage device may be interposed between the detector 116 and the variable power divider 105 and between the detector 116 and the gain variable amplifier 131 to store such settings that control signals are input to the variable power divider and gain variable amplifier depending on the output power level.

Accordingly, control signals can be input to the variable power divider and gain variable amplifier depending on the output power level. This configuration has effects similar to those of this embodiment.

Further, on the basis of the result of a change invariable division ratio made by the variable power divider 105, (1) control may be provided to adjust the amplitude and phase of an output signal from the distortion generating circuit 107 to the variable attenuator 108 and variable phase shifter 109, and (2) control may be provided to adjust the amplitude and phase of an output signal from the power synthesizer 110 to the variable attenuator 111 and the variable phase shifter 112. For example, in this embodiment, an output signal from the detector 116 is used to control the division ratio used by the variable power divider 105. However, the present invention is not limited to this aspect, but it is possible to control the variable attenuators 108 and 111, the variable phase shifters 109 and 112, and the delay circuit 104 using an output signal from the detector 116.

Means including the power divider 103, variable power divider 105, and detector 116 of this embodiment corresponds to the signal variable dividing means of the present invention (a second aspect thereof). Means including the distortion generating circuit 107 of this embodiment corresponds to the distortion signal generating means of the present invention (the second aspect thereof). The power synthesizer 113 of this embodiment corresponds to the signal synthesizing means of the present invention (the second aspect thereof). The power amplifier 114 of this embodiment corresponds to the signal amplifying means of the present invention (the second aspect thereof).

Further, the operation of the means including the power divider 103 and variable power divider 105 of this embodiment corresponds to the signal dividing step of the present invention. The operation of the means including the distortion generating circuit 107 of this embodiment corresponds to the distortion signal generating step of the present invention. The operation of the power synthesizer 113 of this embodiment corresponds to the signal synthesizing step of the present invention. The operation of the power amplifier 114 of this embodiment corresponds to the signal amplifying step of the present invention. The operation of the means including the detector 116 of this embodiment corresponds to the control step of the present invention.

Further, the gain variable amplifier 131 corresponds to power level adjusting means of the present invention (an eighth aspect thereof).

Embodiment 4

Figure 6:
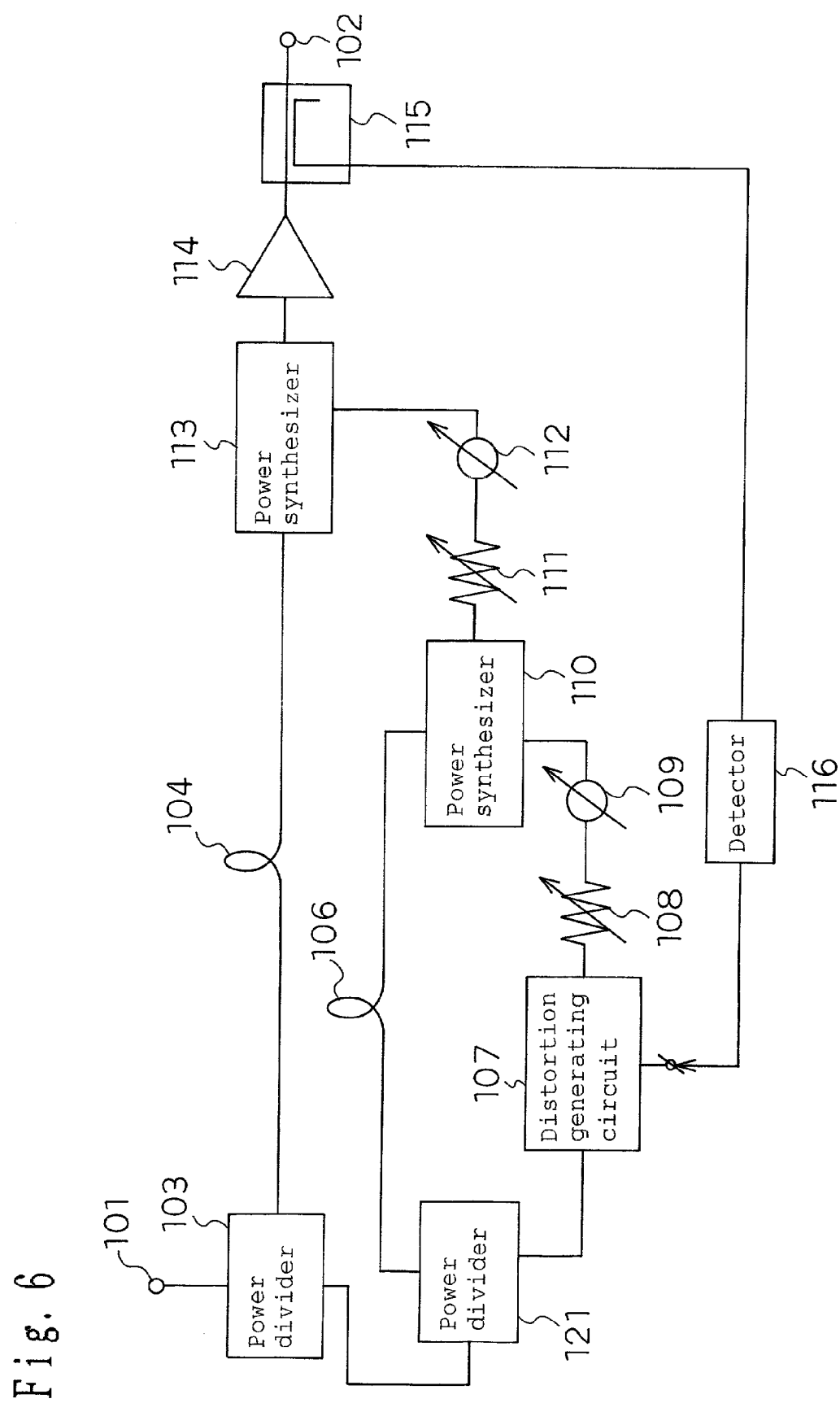
FIG. 6 is a block diagram of a predistortion linearizer according to Embodiment 4 of the present invention.

Now, the configuration and operation of a predistortion linearizer according to Embodiment 4 will be described with reference to FIG. 6. FIG. 6 is a block diagram of the predistortion linearizer of this embodiment.

The predistortion linearizer of this embodiment is constructed similarly to the predistortion linearizer of Embodiment 1, described previously. In the drawing, identical means in both embodiments are denoted by identical reference numerals.

However, in this embodiment, a signal obtained by the detector 116 detecting the output level is used to vary the bias voltage at the distortion generating circuit 107, thereby varying the DC operation condition thereof and thus the saturated output power and distortion characteristic thereof. Thus, the operation level of the distortion generating circuit 107 can be varied equivalently to the case where the operation level thereof is varied using the varied input power level.

Thus, as in Embodiment 1, the operation level of the distortion generating circuit 107 can be arbitrarily equivalently set irrespective of the input signal level and the operation level of the power amplifier 114. As a result, the operation level of the distortion generating circuit 107 can be set so as to most effectively suppress distortion in connection with the operation level of the power amplifier 114. Thus, distortion can be compensated for even if the operation level of the power amplifier 114 changes, thereby realizing a predistortion linearizer with a wide dynamic range. Further, in this embodiment, the DC operation condition of the distortion of the distortion generating circuit 107 is directly varied, thereby eliminating the needs for additional parts to reduce the size of the apparatus compared to Embodiments 1 to 3, described previously.

In this embodiment, the distortion generating circuit 107 and the power amplifier 114 are composed of FETs, but may both be composed of bipolar transistors. Further, the distortion generating circuit may be constructed using diodes, and this construction has effects similar to those of this embodiment.

Figure 7:
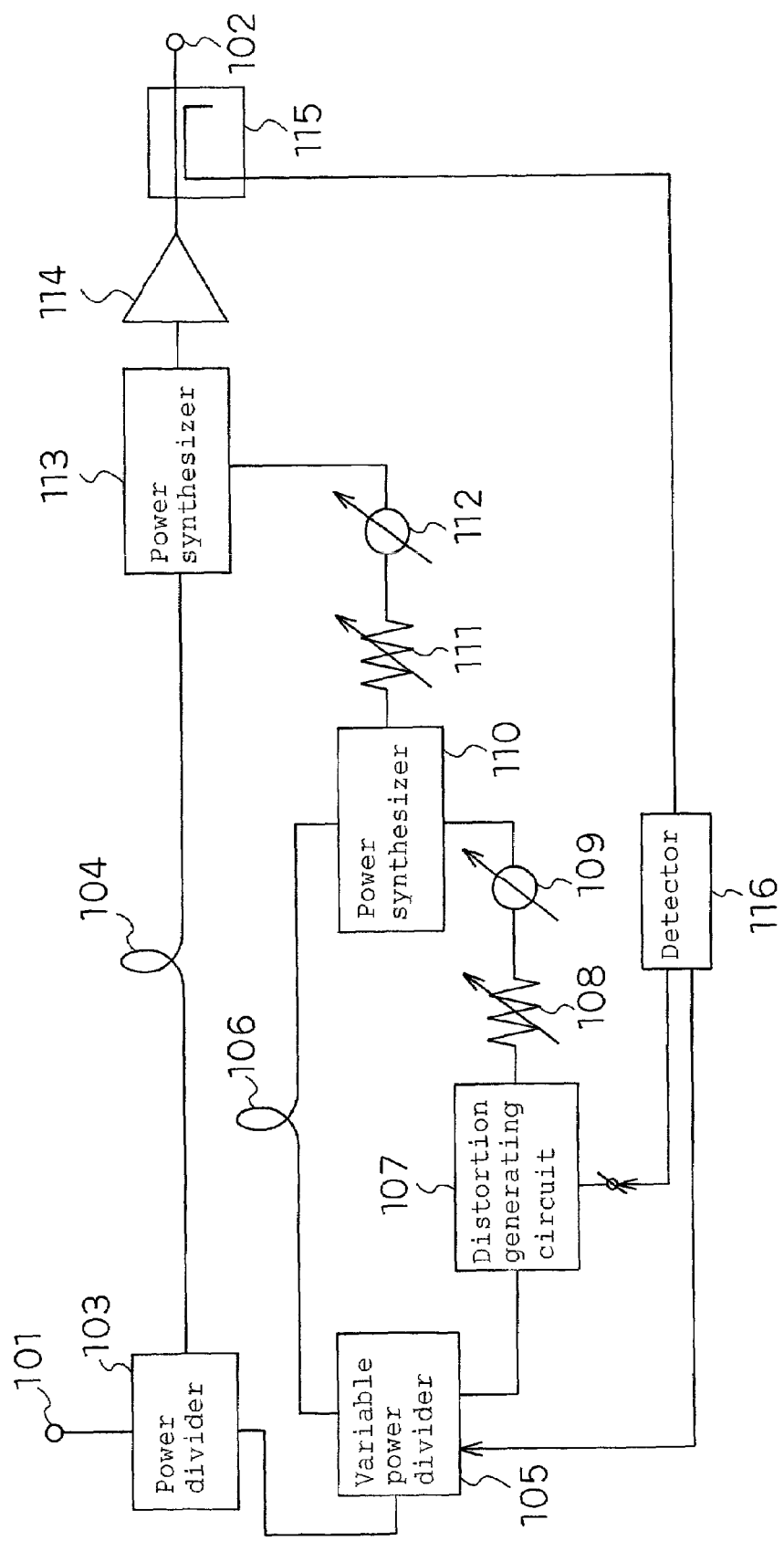
FIG. 7 is a block diagram of a variation of Embodiment 4 in which a power divider 121 is composed of a variable power divider 105.
Figure 8:
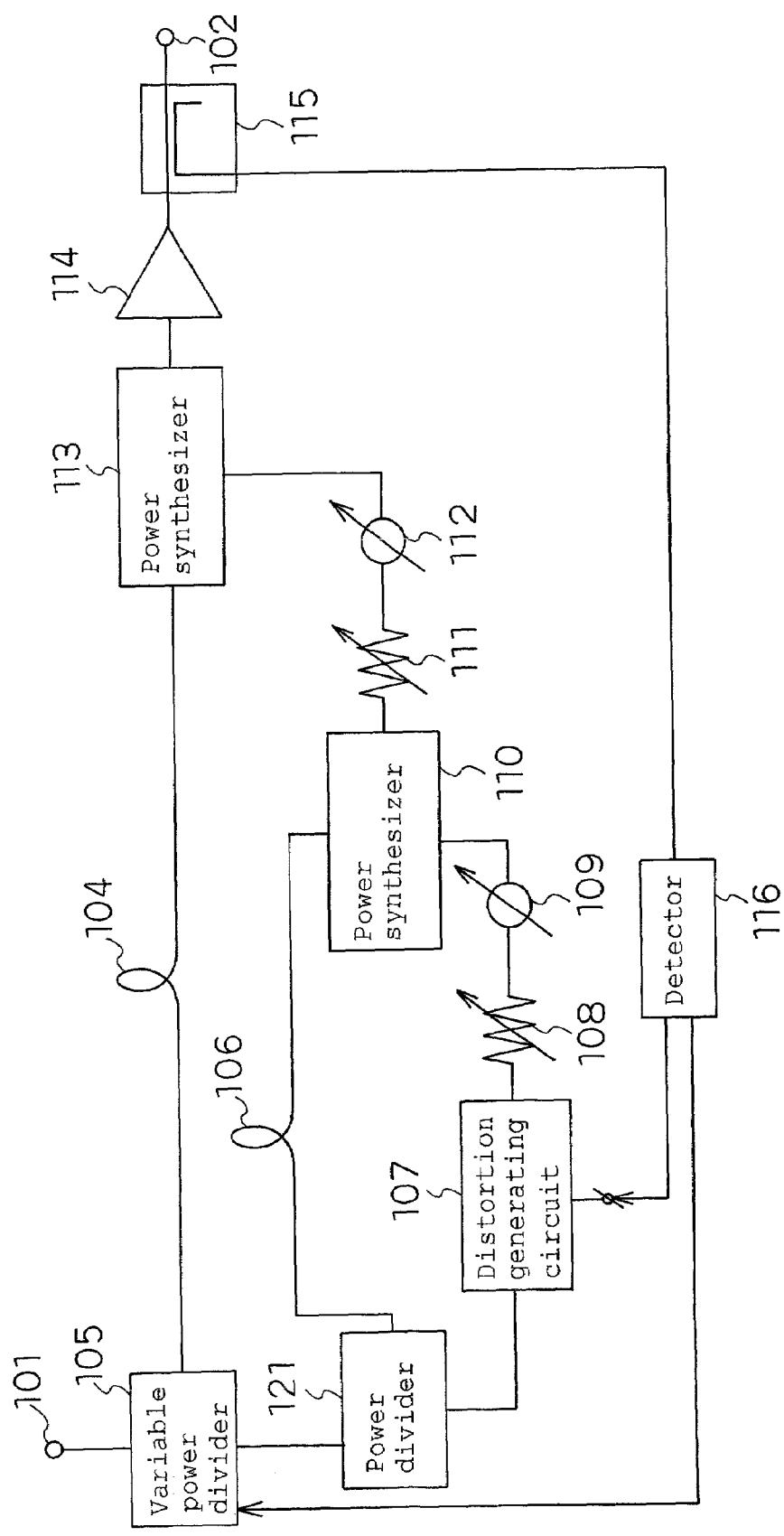
FIG. 8 is a block diagram of a variation of Embodiment 4 in which a power divider 103 is composed of the variable power divider 105.

Furthermore, in this embodiment, the power dividers 103 and 121 have fixed division ratios, but as in Embodiments 1 and 3, described previously, one or both thereof may be variable as shown in FIGS. 7 and 8. FIG. 7 is a block diagram of a variation of this embodiment in which a power divider 121 is composed of a variable power divider 105. FIG. 8 is a block diagram of a variation of this embodiment in which a power divider 103 is composed of the variable power divider 105 (the gain variable power amplifier 131 is also installed at the output side of the delay circuit 104).

In this case (see FIGS. 7 and 8), a signal obtained from the detector 116 is used to control both the variable power divider 105 and the distortion generating circuit 107, thereby making it possible to vary both the power level to be input to the distortion generating circuit 107 and DC operation condition of the distortion generating circuit 107. Consequently, control for suppressing distortion can be more precisely achieved in connection with the output level of the power amplifier 114. Further, the gain variable power amplifier 131 may be composed of a variable attenuator as in Embodiment 3, described previously.

Further, on the basis of the result of a change in bias voltage, (1) control may be provided to adjust the amplitude and phase of an output signal from the distortion generating circuit 107 to the variable attenuator 108 and variable phase shifter 109, and (2) control may be provided to adjust the amplitude and phase of an output signal from the power synthesizer 110 to the variable attenuator 111 and the variable phase shifter 112. For example, in this embodiment, an output signal from the detector 116 is used to vary the bias voltage at the distortion generating circuit 107. Instead, a storage device may be interposed between the detector 116 and the distortion generating circuit 107 to store such settings that a control signal is input to a bias terminal of the distortion generating circuit depending on the output power level. Accordingly, a control signal can be input to the distortion generating circuit depending on the output power level. This configuration has effects similar to those of this embodiment.

Further, in the predistortion linearizer of this embodiment (see FIGS. 7 and 8), an output signal from the detector 116 is used to control the division ratio used by the variable power divider 105. However, the present invention is not limited to this aspect, but an output signal from the detector 116 can be used to control the variable attenuators 108 and 111, the variable phase shifters 109 and 112, and the delay circuit 104.

The power divider 103 of this embodiment corresponds to the signal dividing means of the present invention (a third aspect thereof). Means including the distortion generating circuit 107 of this embodiment corresponds to the distortion signal generating means of the present invention (the third aspect thereof). Means including the detector 116 of this embodiment corresponds to the bias voltage control means of the present invention (the third aspect thereof). The power synthesizer 113 of this embodiment corresponds to the signal synthesizing means of the present invention (the third aspect thereof). The power amplifier 114 of this embodiment corresponds to the signal amplifying means of the present invention (the third aspect thereof).

Further, the operation of the power divider 103 of this embodiment corresponds to the signal dividing step of the present invention. The operation of the means including the distortion generating circuit 107 of this embodiment corresponds to the distortion signal generating step of the present invention. The operation of the power synthesizer 113 of this embodiment corresponds to the signal synthesizing step of the present invention. The operation of the power amplifier 114 of this embodiment corresponds to the signal amplifying step of the present invention. The operation of the means including the detector 116 of this embodiment corresponds to the control step of the present invention.

Embodiment 5

Figure 9:
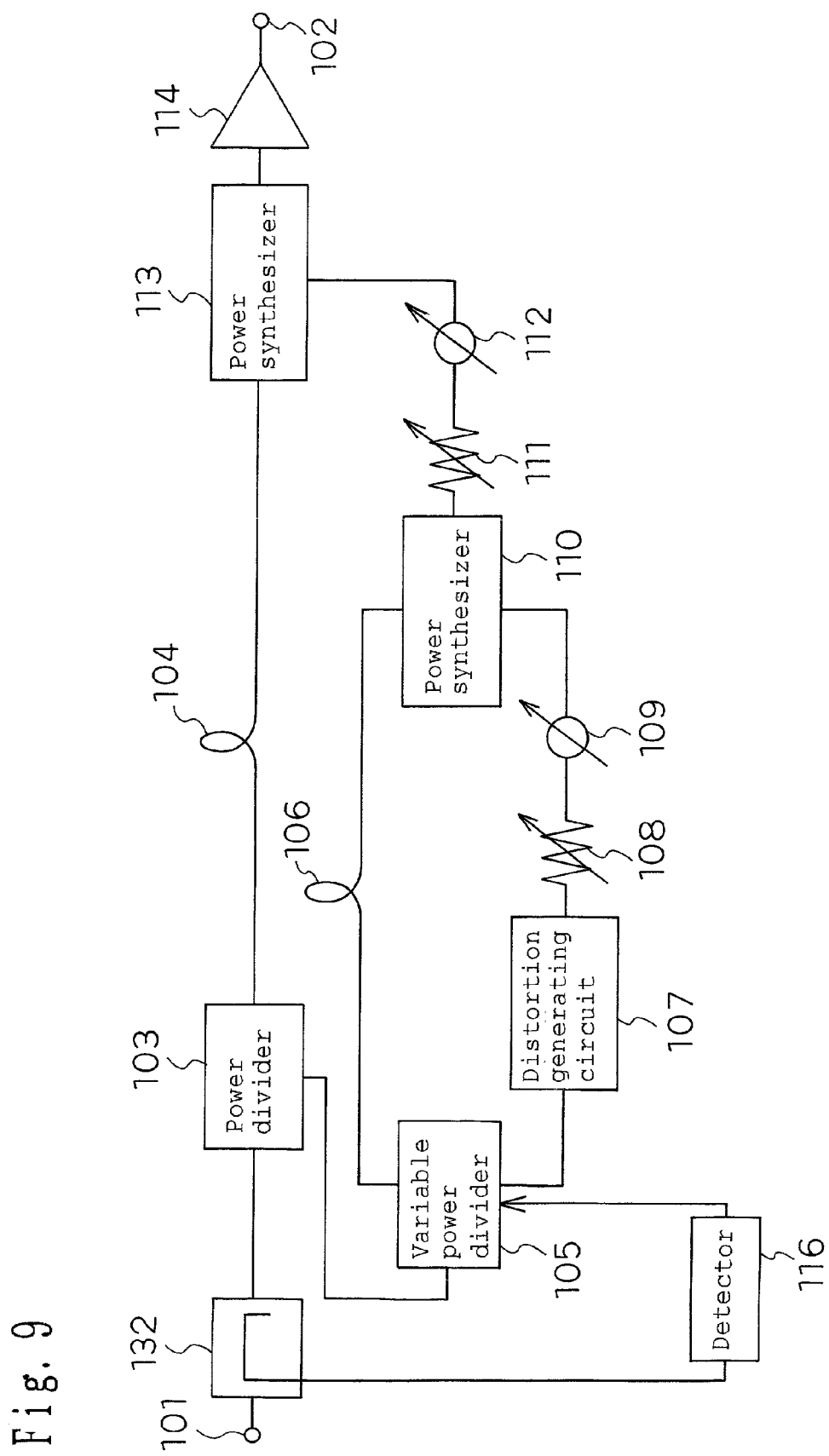
FIG. 9 is a block diagram of a predistortion linearizer according to Embodiment 5 of the present invention.
Figure 10:
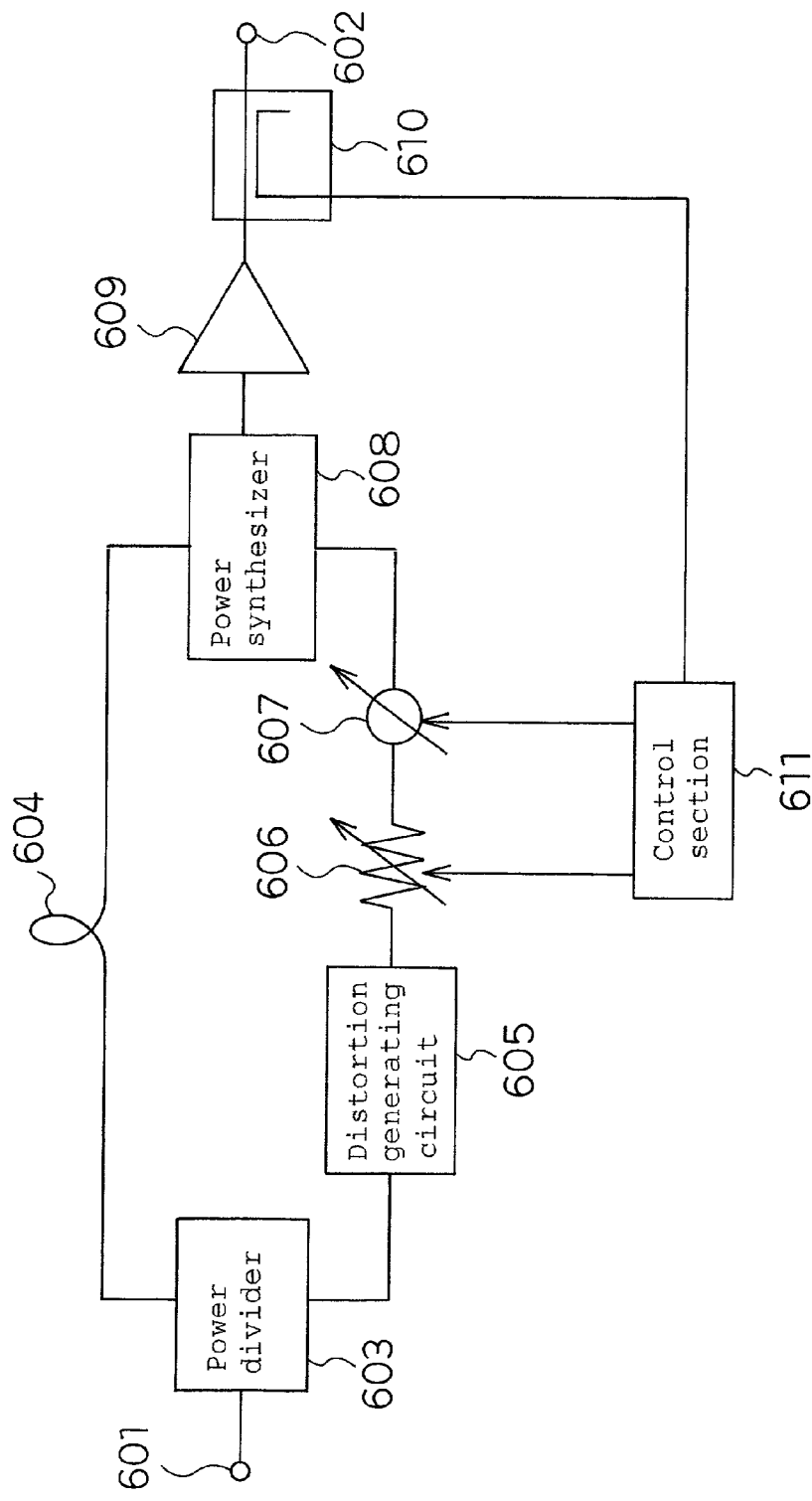
FIG. 10 is a block diagram of a conventional predistortion linearizer.

Now, the configuration and operation of a predistortion linearizer according to Embodiment 5 will be described with reference to FIG. 9. FIG. 9 is a block diagram of the predistortion linearizer of this embodiment.

The predistortion linearizer of this embodiment is constructed similarly to the predistortion linearizer of Embodiment 1, described previously. In the drawing, identical means in both embodiments are denoted by identical reference numerals.

In Embodiment 1, described previously, the directional coupler 115 fetches a part of the output power from the power amplifier so that this part can be used to detect the power level. However, in this embodiment, a directional coupler 132 fetches a part of the signal input through the input terminal 101 so that the detector 116 can use this part to detect the power level. This embodiment serves to avoid power losses that may occur in Embodiment 1 owing to the directional coupler 115, thus generally improving power efficiency.

Thus, as in Embodiment 1, the division ratio used by the variable power divider 105 can be varied depending on the operation level.

In this embodiment, input power is used to detect the operation level without using any output power, but the input power may be used to detect the operation level without using any output power also in Embodiments 1 to 4, described previously.

Further, in this embodiment, an output signal from the detector 116 is used to vary the division ratio used by the variable power divider 105. Instead of it, a storage device may be interposed between the detector 116 and the variable power divider 105 to store such settings that a control signal is input to the variable power divider depending on the output power level. Accordingly, a control signal can be input to the variable power divider depending on the output power level. This configuration has effects similar to those of this embodiment.

Further, in this embodiment, an output signal from the detector 116 is used to control the division ratio used by the variable power divider 105. However, the present invention is not limited to this aspect, but an output signal from the detector 116 can be used to control the variable attenuators 108 and 111, the variable phase shifters 109 and 112, and the delay circuit 104.

The power divider 103 of this embodiment corresponds to the signal dividing means of the present invention (the first aspect thereof). Means including the variable power divider 105 and detector 116 of this embodiment corresponds to the signal adjusting means of the present invention (the first aspect thereof) Means including the distortion generating circuit 107 of this embodiment corresponds to the distortion signal generating means of the present invention (the first aspect thereof) The power synthesizer 113 of this embodiment corresponds to the signal synthesizing means of the present invention (the first aspect thereof). The power amplifier 114 of this embodiment corresponds to the signal amplifying means of the present invention (the first aspect thereof).

Further, the operation of the power divider 103 of this embodiment corresponds to the signal dividing step of the present invention. The operation of the means including the distortion generating circuit 107 of this embodiment corresponds to the distortion signal generating step of the present invention. The operation of the power synthesizer 113 of this embodiment corresponds to the signal synthesizing step of the present invention. The operation of the power amplifier 114 of this embodiment corresponds to the signal amplifying step of the present invention. The operation of the means including the variable power divider 105 and detector 116 of this embodiment corresponds to the control step of the present invention.

A signal input to the power divider 103 by the directional coupler 132 corresponds to an input signal that has been input according to the present invention.

Embodiments 1 to 5 have been described in detail.

The predetermined relationship between the level of a difference between the signal amplitudes of predetermined frequency components contained in a distortion signal generated by the distortion signal generating means of the present invention and the level of a difference between the signal amplitudes of the predetermined frequency components contained in a distortion signal generated by the signal amplifying means means that a difference between the signal amplitudes, i.e. dBc values, of frequency components f3 and f4 contained in a distortion signal generated by the distortion signal generating circuit 107 substantially equals a difference between the signal amplitudes, i.e. dBc values, of the frequency components f3 and f4 contained in a distortion signal generated by the power amplifier 114, in the above-described embodiments. However, the present invention is not limited to this aspect. For example, (absolute) level ratio between the signal amplitudes of frequency components f3 and f4 contained in a distortion signal generated by the distortion signal generating circuit 107 may substantially equal (absolute) level ratio between the signal amplitudes of the frequency components f3 and f4 contained in a distortion signal generated by the power amplifier 114 (In short, it is desirable that the intermodulation distortion components that may occur in the signal amplifying means of the present invention at arbitrary power levels can be effectively suppressed.).

The present invention includes a predistortion linearizer comprising signal dividing means of dividing signals based on an externally input signal, distortion signal generating means of generating a distortion signal using one of the divided signals, signal synthesizing means of synthesizing the other of the divided signals with the generated distortion signal, and signal amplifying means of amplifying the synthesized signal and outputting an externally output signal, and wherein input power and/or a bias voltage supplied to the distortion signal generating means is controlled such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of the predetermined frequency components contained in the distortion signal generated by the distortion signal generating means and a difference between the phases of the predetermined frequency components contained by the distortion signal generated by the signal amplifying means.

The invention can also be a program used to direct a computer to perform the functions of all or a part of means (or devices, elements, circuits, units, etc.) of the predistortion linearizer according to the invention, and a program cooperating with the computer. It is obvious that the computer according to the invention can include not only purely hardware such as a CPU but also firmware, an OS, and peripheral units.

Furthermore, the invention can also be a program used to direct a computer to perform the operations of all or a part of steps (or processes, operations, effects, etc.) of the predistortion distortion compensation method according to the invention, and a program cooperating with the computer.

A part of the means (or devices, elements, circuits, unit, etc.) of the invention, and a part of the steps (or processes, operations, effects, etc.) of the invention indicate some means or steps in the plurality of means or steps, or a part of the functions or a part of the operations in one means or step.

A part of the devices (or elements, circuit, units, etc.) of the invention indicate some devices in the plurality of devices, or a part of the means (or elements, circuits, units, etc.) in one device, or indicate a part of the functions in one means.

The invention further includes a computer-readable storage medium storing a program according to the invention. An embodiment of the program according to the invention can be stored in a computer-readable storage medium, and coordinate with the computer. An embodiment of the program according to the invention can also be transmitted through a transmission medium, read by the computer, and cooperate with the computer. A storage medium can be ROM, etc., and a transmission medium can be a transmission medium such as Internet, etc., light, electric wave, sound wave, etc.

The configuration of the invention can be realized by either software or hardware.

The invention can also be a storage medium storing program used to direct a computer to perform the functions of all or a part of means of all or a part of the predistortion linearizer according to the invention, and a computer-readable storage medium, and the program can cooperate with the computer to perform the above mentioned functions.

The invention can also be a storage medium storing program used to direct a computer to perform the operations of all or a part of steps of all or a part of the predistortion distortion compensation method according to the invention, and a computer-readable storage medium, and the program can cooperate with the computer to perform the above mentioned operations.

Thus, a predistortion linearizer with a wide dynamic range can be realized.

As is apparent from the above description, the present invention has the advantage of providing a predistortion linearizer in which distortion can be compensated for over a wide range of output levels.

What is claimed is:

1. A predistortion linearizer for wireless communication device, comprising:

signal dividing means of dividing an input signal that has been input, into two signals;

signal adjusting means of using one of said divided signals to execute predetermined adjustment and outputting a signal based on a result of the adjustment;

distortion signal generating means of generating a distortion signal using the signal output from said signal adjusting means;

signal synthesizing means of synthesizing the other of said divided signals with said generated distortion signal; and signal amplifying means of amplifying said synthesized signal and outputting an output signal, and wherein said signal adjusting means executes said predetermined adjustment such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between phases of said predetermined frequency components contained in the distortion signal generated by said signal amplifying means.

2. The predistortion linearizer according to claim 1, further comprising:

a first delay circuit that adjusts a propagation delay time for the other of the signals divided by said signal dividing means; and detection signal dividing means of dividing the signal amplified by said signal amplifying means, into a detection signal and an external signal, and wherein said signal adjusting means has a detector that detects the level of said detection signal and outputs the level as a control signal, and a variable power divider that divides one of the signals divided by said signal dividing means, at a variable division ratio, said distortion signal generating means has a second delay circuit that adjusts a propagation delay time for one of the signals divided by said variable power divider, a distortion generating circuit that generates said distortion signal by receiving the other of the signals divided by said variable power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and said variable power divider varies said division ratio using said control signal.

3. The predistortion linearizer according to claim 1, further comprising:
   a first delay circuit that adjusts a propagation delay time for the other of the signals divided by said signal dividing means;
   detection signal dividing means of dividing the signal amplified by said signal amplifying means, into a detection signal and an external signal; and
   a power divider that divides one of the signals divided by said signal dividing means, and
   wherein said signal adjusting means has a detector that detects the level of said detection signal and outputs the level as a control signal, and power level adjusting means of adjusting the power level of one of the signals divided by said power divider,
   said distortion signal generating means has a second delay circuit that adjusts a propagation delay time for the other of the signals divided by said power divider, a distortion generating circuit that generates said distortion signal by receiving the signal adjusted by said power level adjusting means, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and
   wherein the gain of said power level adjusting means is varied using said control signal.

4. The predistortion linearizer according to claim 1, further comprising:
   detection signal dividing means of dividing an external signal into said input signal and said detection signal; and
   a first delay circuit that adjusts a propagation delay time for the other of the signals divided by said signal dividing means, and
   wherein said signal adjusting means has a detector that detects the level of said detection signal and outputs the level as a control signal, and a variable power divider that divides one of the signals divided by said signal dividing means,
   said distortion signal generating means has a second delay circuit that adjusts a propagation delay time for one of the signals divided by said variable power divider, a distortion generating circuit that generates said distortion signal by receiving the other of the signals divided by said variable power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and
   wherein said variable power divider varies said division ratio using said control signal.

5. The predistortion linearizer according to any one of claims 2 to 4, further comprising a storage device that stores data used to generate said control signal.

6. The predistortion linearizer according to any one of claims 2 to 4, wherein said variable power divider is constructed by using a variable directional coupler.

7. The predistortion linearizer according to any one of claims 2 to 4, wherein said delay circuit is constructed by using a filter.

8. The predistortion linearizer according to any one of claims 2, 3, and 4, further comprising a control circuit that provides, on the basis of a result of said predetermined adjustment, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

9. A predistortion linearizer for wireless communication device, comprising:
   signal variable dividing means of dividing an input signal that has been input, into two signals at a variable division ratio;
   distortion signal generating means of generating a distortion signal using one of said divided signals;
   signal synthesizing means of synthesizing the other of said divided signals with said generated distortion signal; and
   signal amplifying means of amplifying said synthesized signal and outputting an output signal, and
   wherein said signal variable dividing means varies said division ratio such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between the phases of said predetermined frequency components contained in the distortion signal generated by said signal amplifying means.

10. The predistortion linearizer according to claim 9, further comprising:
    a first delay circuit that adjusts a propagation delay time for the other of the signals divided by said signal dividing means;
    power level adjusting means of adjusting the power level of an output signal from said first delay circuit; and
    detection signal dividing means of dividing the signal amplified by said signal amplifying means, into a detection signal and an external signal, and
    wherein said signal variable dividing means has a detector that detects the level of said detection signal and outputs the level as a control signal, a variable power divider that variably divides said input signal, and a power divider that divides one of the signals divided by said variable power divider, said distortion signal generating means has a second delay circuit that adjusts a propagation delay time for one of the signals divided by said power divider, a distortion generating circuit that generates said distortion signal by receiving the other of the signals divided by said power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein by using said control signal, said signal variable dividing means varies said division ratio and the gain of said power level adjusting means is varied.

11. The predistortion linearizer according to claim 3 or 10, wherein said power level adjusting means is constructed using a variable gain amplifier or a variable attenuator.

12. The predistortion linearizer according to claim 10, further comprising a control circuit that provides, on the basis of a result of the variation in said division ratio, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

13. A predistortion linearizer for wireless communication device, comprising:

signal dividing means of dividing an input signal that has been input, into two signals;

distortion signal generating means of generating a distortion signal using one of said divided signals and a predetermined bias voltage;

bias voltage control means of controlling said bias voltage;

signal synthesizing means of synthesizing the other of said divided signals with said generated distortion signal; and signal amplifying means of amplifying said synthesized signal and outputting an output signal, and wherein said bias voltage control means controls said bias voltage such that (1) there is a predetermined relationship between the level of a difference between the signal amplitudes of predetermined frequency components contained in a distortion signal generated by said distortion signal generating means and the level of a difference between the signal amplitudes of said predetermined frequency components contained in a distortion signal generated by said signal amplifying means and/or (2) there is a predetermined relationship between a difference between the phases of said predetermined frequency components contained in the distortion signal generated by said distortion signal generating means and a difference between the phases of said predetermined frequency components contained in the distortion signal generated by said signal amplifying means.

14. The predistortion linearizer according to any one of claims 1 to 13, wherein the predetermined relationship between the level of the difference between the signal amplitudes of the predetermined frequency components contained in the distortion signal generated by said distortion signal generating means and the level of the difference between the signal amplitude of said predetermined frequency components contained in the distortion signal generated by said signal amplifying means means that a difference between the signal amplitude, i.e. dBc values, of said predetermined frequency components contained in the distortion signal generated by said distortion signal generating means substantially equals a difference between the signal amplitudes, i.e. dBc values, of said predetermined frequency components contained in the distortion signal generated by said signal amplifying means.

15. The predistortion linearizer according to any one of claims 1 to 13, wherein the predetermined relationship between the difference between the phases of said predetermined frequency components contained in the distortion signal generated by said distortion signal generating means and the difference between the phases of said predetermined frequency components contained in the distortion signal generated by said signal amplifying means means that a difference between the phases, i.e. deg values, of said predetermined frequency components contained in the distortion signal generated by said distortion signal generating means substantially equals a difference between the phases, i.e. deg values, of said predetermined frequency components contained in the distortion signal generated by said signal amplifying means.

16. The predistortion linearizer according to claim 13, further comprising:

a first delay circuit that adjusts a propagation delay time for the other of the signals divided by said signal dividing means; and detection signal dividing means of dividing the signal amplified by said signal amplifying means, into a detection signal and an external signal, and wherein said bias voltage control means has a detector that detects the level of said detection signal and outputs the level as a control signal, said distortion signal generating means has a power divider that divides one of the signals divided by said signal dividing means, a second delay circuit that adjusts a propagation delay time for one of the signals divided by said power divider, a distortion generating circuit that generates said distortion signal by receiving the other of the signals divided by said power divider, as an input, first vector adjusting means of adjusting the amplitude and phase of an output signal from said distortion generating circuit, a power synthesizer that synthesizes an output signal from said second delay circuit with an output signal from said first vector adjusting means, and second vector adjusting means of adjusting the amplitude and phase of an output signal from said power synthesizer and outputting the adjusted signal as said distortion signal, and wherein said bias voltage is controlled by using said control signal.

17. The predistortion linearizer according to claim 16, further comprising a control circuit that provides, on the basis of a result of the control of said bias voltage, (1) control required to allow said first vector adjusting means to adjust the amplitude and phase of the output signal from said distortion generating circuit, and (2) control required to allow said second vector adjusting means to adjust the amplitude and phase of the output signal from said power synthesizer.

18. A program for causing a computer for wireless communication device, to execute all or part of the steps of:

dividing an input signal that has been input, into two signals;

generating a distortion signal using one of said divided signals; synthesizing the other of said divided signals with said generated distortion signal; amplifying said synthesized signal and outputting an output signal; and controlling input power and/or a bias voltage used in said distortion signal generating step such that (1) there is a predetermined relationship between the level of a difference between the signal amplitudes of predetermined frequency components contained in a distortion signal generated in said distortion signal generating step and the level of a difference between the signal amplitudes of said predetermined frequency components contained in a distortion signal generated in said signal amplifying step and/or (2) there is a predetermined relationship between a difference between the phases of said predetermined frequency components contained in the distortion signal generated in said distortion signal generating step and a difference between the phases of said predetermined frequency components contained in the distortion signal generated in said signal amplifying step; in the predistortion distortion compensation method according to claim 17.

19. A predistortion linearizer for wireless communication device, comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

said second power dividing means can vary power division ratio in response to a control signal, the control signal is supplied to at least one of said second power dividing means and said distortion generating circuit, and the control signal is supplied from an output of said detecting means.

20. A predistortion linearizer for wireless communication device, comprising:

first power dividing means of dividing an input signal;

first propagation time delay means of adjusting a propagation delay time for the signal divided by said first power dividing means;

power level adjusting means of adjusting the power level of an output signal from said first propagation time delay means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said power level adjusting means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

a power division ratio used by said first power dividing means and gain of said power level adjusting means can be varied in response to a control signal, the control signal is supplied to at least one of said first power dividing means, said power level adjusting means, and said distortion generating circuit, and the control signal is supplied from an output of said detecting means.

21. A predistortion linearizer for wireless communication device, comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

power level adjusting means of adjusting the power level of the signal divided by said second power dividing means;

distortion generating means of generating a distortion signal by receiving the signal divided by said power level adjusting means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

gain of said power level adjusting means can be varied in response to a control signal, and the control signal is supplied from an output of said detecting means.

22. A predistortion linearizer for wireless communication device, comprising:

first power dividing means of dividing an input signal;

first propagation time delay means of adjusting a propagation delay time for the signal divided by said first power dividing means;

second power dividing means of dividing the signal divided by said first power dividing means;

second propagation time delay means of adjusting a propagation delay time for the signal divided by said second power dividing means;

distortion generating means of generating a distortion signal by receiving the signal divided by said second power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means;

third power dividing means of dividing an output signal from said power amplifying means; and detecting means of detecting the level of the signal divided by said third power dividing means, and in that:

a bias voltage at said distortion generating means can be varied in response to a control signal, and the control signal is supplied from an output of said detecting means.

23. A predistortion linearizer for wireless communication device, comprising:

first power dividing means of dividing an input signal;

second power dividing means of dividing the signal divided by said first power dividing means;

first propagation time delay means of adjusting a propagation delay time for the signal divided by said second power dividing means;

third power dividing means of dividing the signal divided by said second power dividing means;

second propagation time delay means of adjusting a propagation delay time for the signal divided by said third power dividing means;

distortion generating means of generating a distortion signal by receiving the signal divided by said third power dividing means, as an input;

first vector adjusting means of adjusting the amplitude and phase of an output signal from said distortion generating means;

first power synthesizing means of synthesizing an output signal from said second propagation time delay means with an output signal from said first vector adjusting means;

second vector adjusting means of adjusting the amplitude and phase of an output signal from said first power synthesizing means;

second power synthesizing means of synthesizing an output signal from said first propagation time delay means with an output signal from said second vector adjusting means;

power amplifying means of amplifying an output signal from said second power synthesizing means; and detecting means of detecting the level of the signal divided by said first power dividing means, and in that:

said third power dividing means can vary power division ratio in response to a control signal, the control signal is supplied to at least one of said third power dividing means and said distortion generating circuit, and the control signal is supplied from an output of said detecting means.

24. A predistortion distortion compensation method for wireless communication device, comprising:

a signal dividing step of dividing an input signal that has been input, into two signals;

a distortion signal generating step of generating a distortion signal using one of said divided signals;

a signal synthesizing step of synthesizing the other of said divided signals with said generated distortion signal;

a signal amplifying step of amplifying said synthesized signal and outputting an output signal; and a control step of controlling input power and/or a bias voltage used in said distortion signal generating step such that (1) there is a predetermined relationship between the level of a difference between the signal amplitudes of predetermined frequency components contained in a distortion signal generated in said distortion signal generating step and the level of a difference between the signal amplitudes of said predetermined frequency components contained in a distortion signal generated in said signal amplifying step and/or (2) there is a predetermined relationship between a difference between the phases of said predetermined frequency components contained in the distortion signal generated in said distortion signal generating step and a difference between the phases of said predetermined frequency components contained in the distortion signal generated in said signal amplifying step.

25. A computer-processable medium carrying a program according to claim 24.

* * * * *

UNITED STATES PATENT AND TRADEMARK OFFICE
CERTIFICATE OF CORRECTION

PATENT NO. : 7,046,972 B2
APPLICATION NO. : 10/118704
DATED : May 16, 2006
INVENTOR(S) : Toshimitsu Matsuyoshi et al.

It is certified that error appears in the above-identified patent and that said Letters Patent is hereby corrected as shown below:

At Column 26, lines 6-7, "any one of claims 2 to 4" should read --any one of claims 2, 3, 4, 10, and 16--

At Column 26, lines 9-10, "any one of claims 2 to 4" should read --any one of claims 2, 3, 4, 10, and 16--

At Column 26, lines 12-13, "any one of claims 2 to 4" should read --any one of claims 2, 3, 4, 10, and 16--

At Column 27, lines 63-64, "any one of claims 1 to 13" should read --any one of claims 1, 9, and 13--

At Column 28, lines 12-13, "any one of claims 1 to 13" should read --any one of claims 1, 9, and 13--

At Column 28, line 65, "a computer for wireless" should read --a computer of a wireless--

Signed and Sealed this

Fourteenth Day of November, 2006

JON W. DUDAS
*Director of the United States Patent and Trademark Office*